US008392011B2

(12) United States Patent
Segawa et al.

(10) Patent No.: US 8,392,011 B2
(45) Date of Patent: Mar. 5, 2013

(54) SEMICONDUCTOR WAFER PROCESSING TAPE WINDING BODY, SEMICONDUCTOR WAFER PROCESSING TAPE STICKING APPARATUS AND SEMICONDUCTOR WAFER PROCESSING APPARATUS THAT USE THE SEMICONDUCTOR WAFER PROCESSING TAPE WINDING BODY

(75) Inventors: Takeshi Segawa, Itabashi-ku (JP); Koichi Yamaguchi, Itabashi-ku (JP); Yuichi Iwakata, Itabashi-ku (JP)

(73) Assignee: Lintec Corporation, Tokyo (JP)

( * ) Notice: Subject to any disclaimer, the term of this patent is extended or adjusted under 35 U.S.C. 154(b) by 1025 days.

(21) Appl. No.: 11/476,382

(22) Filed: Jun. 28, 2006

(65) Prior Publication Data

US 2007/0162175 A1    Jul. 12, 2007

(30) Foreign Application Priority Data

Jun. 29, 2005    (JP) ................................. 2005-190388

(51) Int. Cl.
*G06F 19/00*    (2011.01)
*H01L 21/00*    (2006.01)
*B29C 65/00*    (2006.01)
*B32B 37/00*    (2006.01)
(52) U.S. Cl. ............ 700/116; 700/121; 700/109; 438/5; 438/118; 438/113; 156/496
(58) Field of Classification Search .................. 700/116, 700/109, 121; 438/5, 464, 118, 113; 156/496
See application file for complete search history.

(56) References Cited

U.S. PATENT DOCUMENTS

| 3,643,849 | A  | * | 2/1972  | Roberts       | 242/615.3 |
| 5,673,195 | A  | * | 9/1997  | Schwartz et al. | 700/115 |
| 6,351,684 | B1 | * | 2/2002  | Shirley et al. | 700/121 |
| 6,405,096 | B1 | * | 6/2002  | Toprac et al.  | 700/121 |
| 6,427,093 | B1 | * | 7/2002  | Toprac         | 700/121 |
| 6,488,212 | B1 | * | 12/2002 | Maeder         | 235/494 |
| 6,582,973 | B1 | * | 6/2003  | Laaksonen et al. | 438/5 |
| 6,640,151 | B1 | * | 10/2003 | Somekh et al.  | 700/121 |
| 6,716,651 | B2 | * | 4/2004  | Weng et al.    | 438/14 |
| 6,718,223 | B1 | * | 4/2004  | Iwakata et al. | 700/121 |

(Continued)

FOREIGN PATENT DOCUMENTS

| CN | 1498827 A | 11/2003 |
| CN | 1473351 A | 2/2004 |

(Continued)

*Primary Examiner* — Jeffrey A Gaffin
*Assistant Examiner* — Jason Lin
(74) *Attorney, Agent, or Firm* — The Webb Law Firm

(57) ABSTRACT

A semiconductor wafer processing tape sticking apparatus is provided and is capable of sticking a semiconductor wafer processing tape to a semiconductor wafer under the optimum conditions based on the processing data that has been written to a data carrier member and that has been read from the data carrier member without accessing the host computer unlike a conventional method. The semiconductor wafer processing tape sticking apparatus includes: a feeding apparatus provided with a feeding shaft to which a semiconductor wafer processing tape winding body can be detachably attached; a tape data read/write device for reading and writing the processing data that has been written to a data carrier member of the semiconductor wafer processing tape winding body; and a tape sticking apparatus for sticking a semiconductor wafer processing tape that has been fed out from the feeding apparatus to the semiconductor wafer based on the processing data that has been read by the tape data read/write device.

17 Claims, 19 Drawing Sheets

U.S. PATENT DOCUMENTS

| | | | |
|---|---|---|---|
| 6,996,449 B2 * | 2/2006 | Imai | 700/121 |
| 7,016,753 B2 * | 3/2006 | Yamazaki | 700/121 |
| 7,129,145 B2 * | 10/2006 | Kawamura et al. | 438/381 |
| 7,155,300 B2 * | 12/2006 | Akram et al. | 700/121 |
| 7,239,934 B2 * | 7/2007 | Morinaga et al. | 700/121 |
| 7,273,166 B2 | 9/2007 | Suhara et al. | |
| 2001/0020325 A1 * | 9/2001 | Lueckehe | 29/740 |
| 2002/0056523 A1 * | 5/2002 | Ishinoda | 156/496 |
| 2003/0090829 A1 * | 5/2003 | Johnson et al. | 360/69 |
| 2003/0123174 A1 * | 7/2003 | Hennecken et al. | 360/51 |
| 2004/0004789 A1 * | 1/2004 | Watanabe et al. | 360/132 |
| 2004/0109257 A1 * | 6/2004 | Beck et al. | 360/76 |
| 2004/0181938 A1 | 9/2004 | Suzuki et al. | |
| 2005/0027490 A1 * | 2/2005 | Kawashima | 702/189 |
| 2005/0036274 A1 * | 2/2005 | Suhara et al. | 361/600 |
| 2005/0159835 A1 * | 7/2005 | Yamada et al. | 700/109 |
| 2005/0231841 A1 * | 10/2005 | Kuo et al. | 360/15 |
| 2005/0283266 A1 | 12/2005 | Geraci et al. | |
| 2006/0028748 A1 * | 2/2006 | Coehoorn | 360/31 |
| 2006/0030130 A1 | 2/2006 | Shao et al. | |
| 2006/0079011 A1 | 4/2006 | Tandy et al. | |
| 2007/0131344 A1 * | 6/2007 | Tsujimoto et al. | 156/248 |
| 2009/0014124 A1 * | 1/2009 | Tsujimoto et al. | 156/344 |

FOREIGN PATENT DOCUMENTS

| | | |
|---|---|---|
| EP | 0 157 508 A2 | 9/1985 |
| JP | 60-196956 A | 10/1985 |
| JP | 60-223139 A | 11/1985 |
| JP | 5-032946 A | 2/1993 |
| JP | 8-27239 A | 1/1996 |
| JP | 2000281268 A | 10/2000 |
| JP | 2000-331962 A | 11/2000 |
| JP | 2001019278 A * | 1/2001 |
| JP | 2001203523 A | 7/2001 |
| JP | 2001332521 A * | 11/2001 |
| JP | 2001354343 A | 12/2001 |
| JP | 2003006481 A | 1/2003 |
| JP | 2005136305 A | 5/2005 |
| JP | 2005162335 A * | 6/2005 |
| TW | I234234 B | 6/2005 |

* cited by examiner

Fig. 11
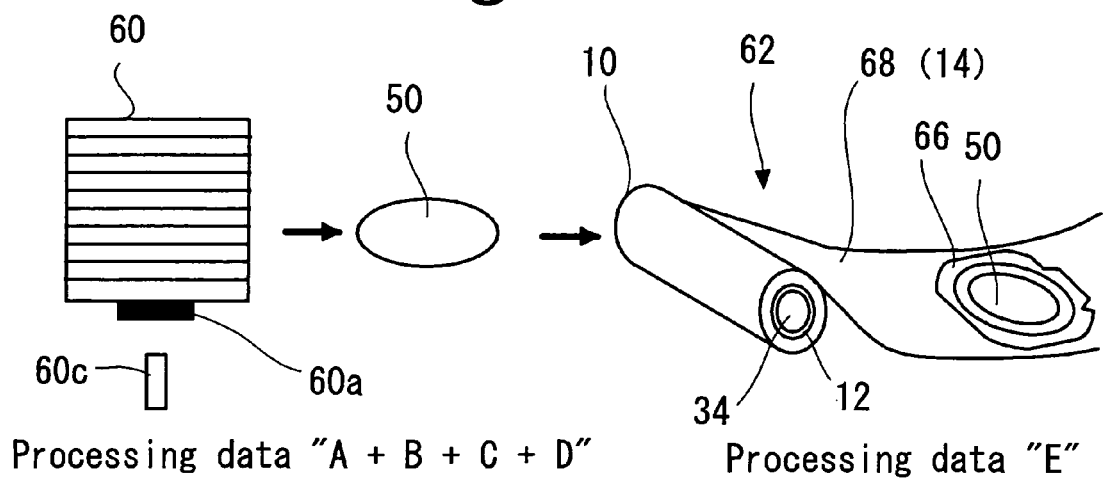
Processing data "A + B + C + D"        Processing data "E"
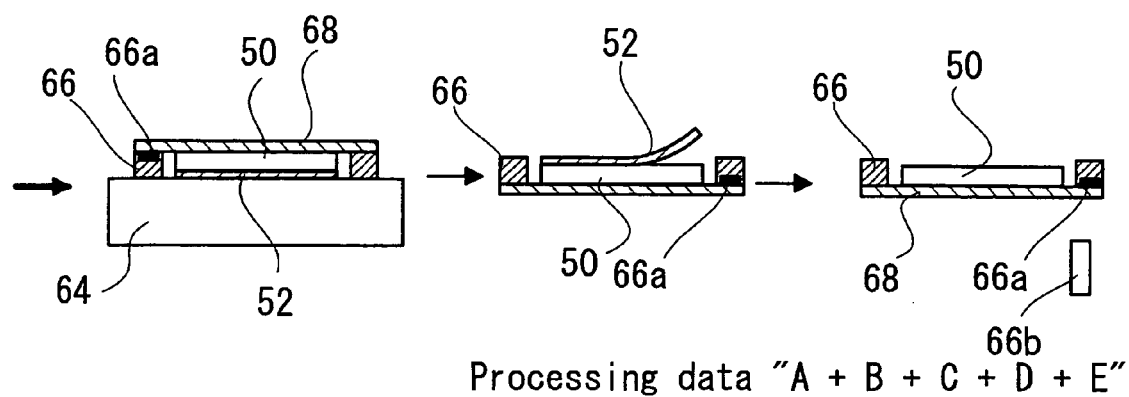
Processing data "A + B + C + D + E"
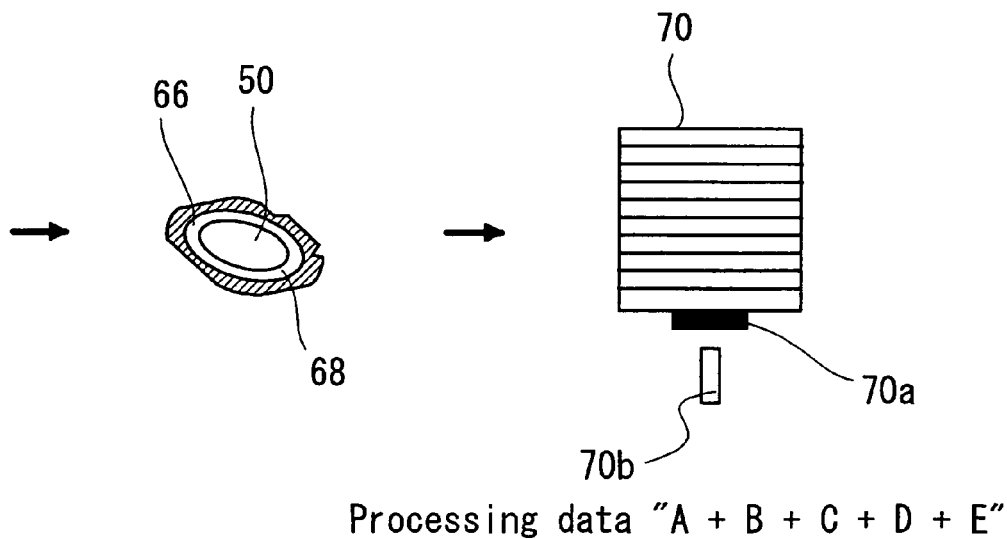
Processing data "A + B + C + D + E"

Fig. 12
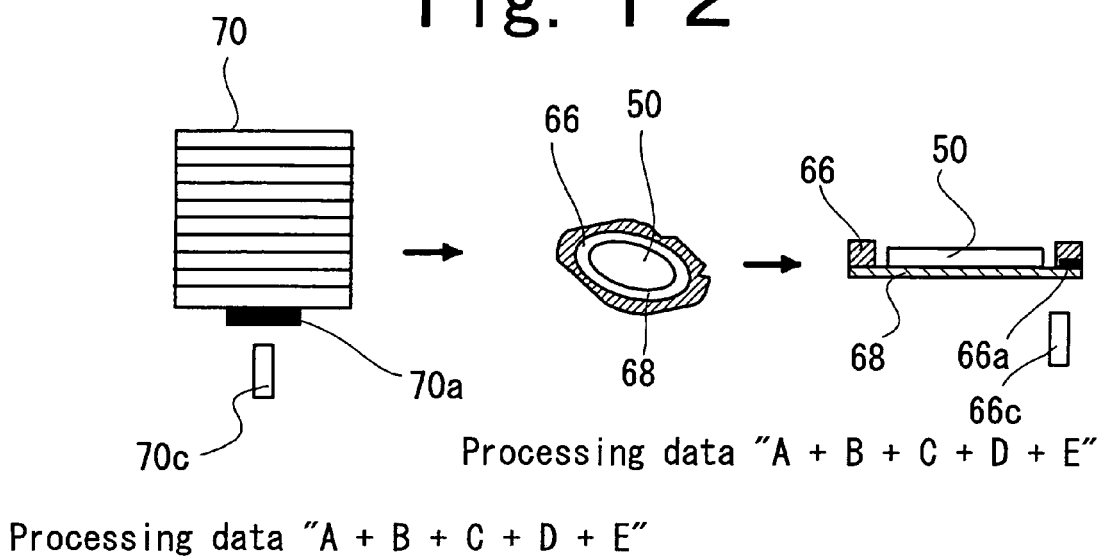
Processing data "A + B + C + D + E"
Processing data "A + B + C + D + E"
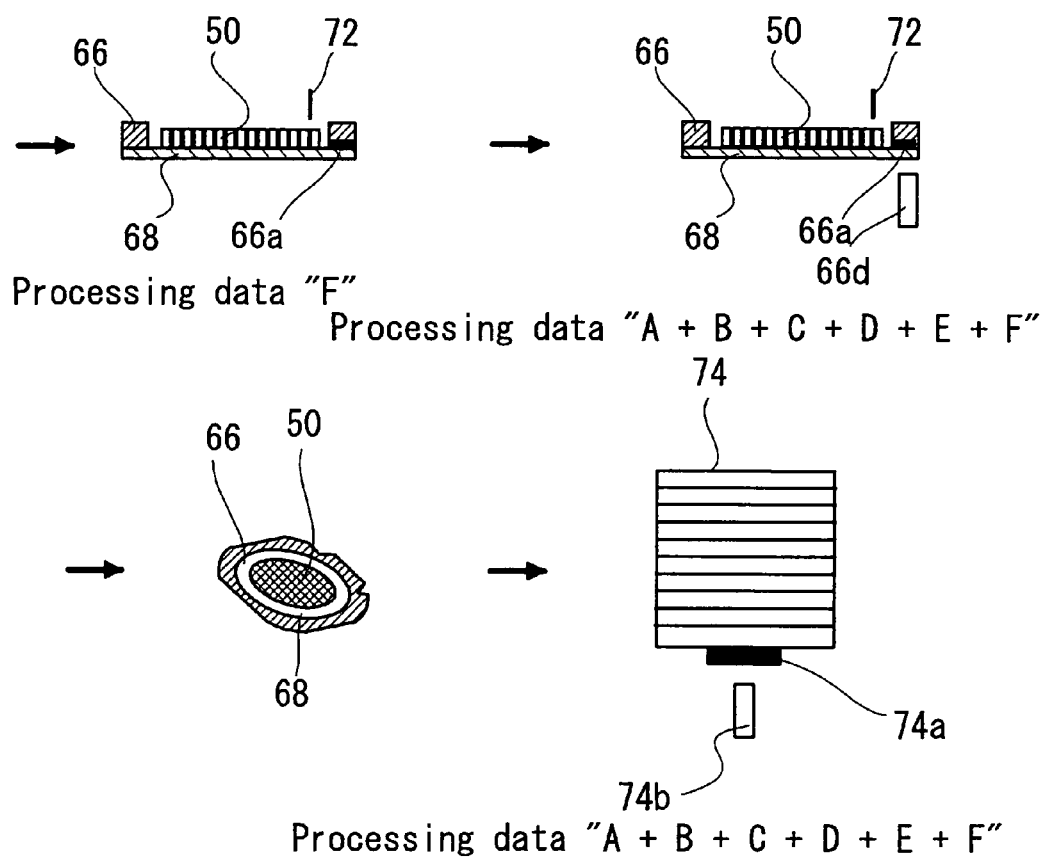
Processing data "F"
Processing data "A + B + C + D + E + F"
Processing data "A + B + C + D + E + F"

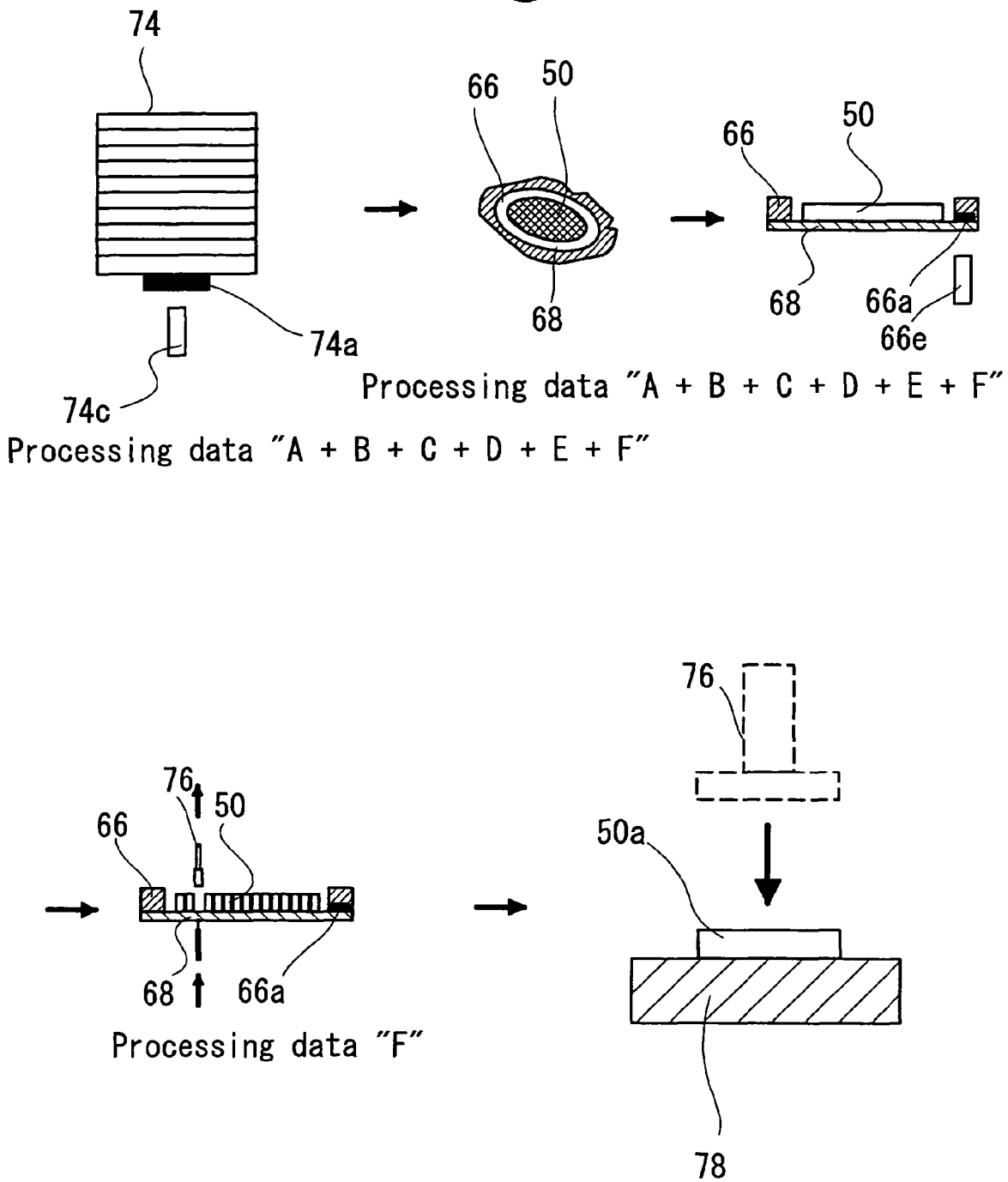

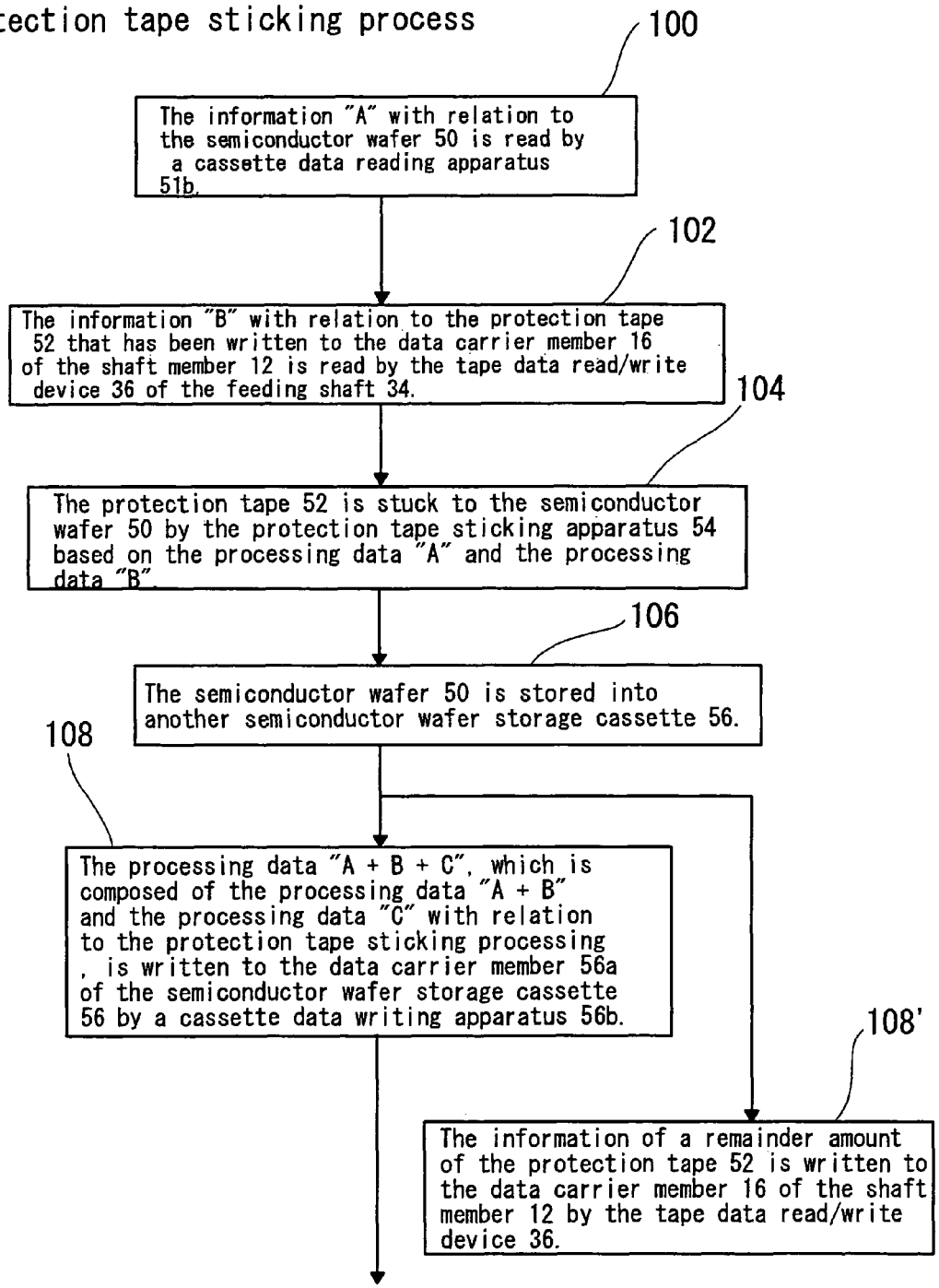

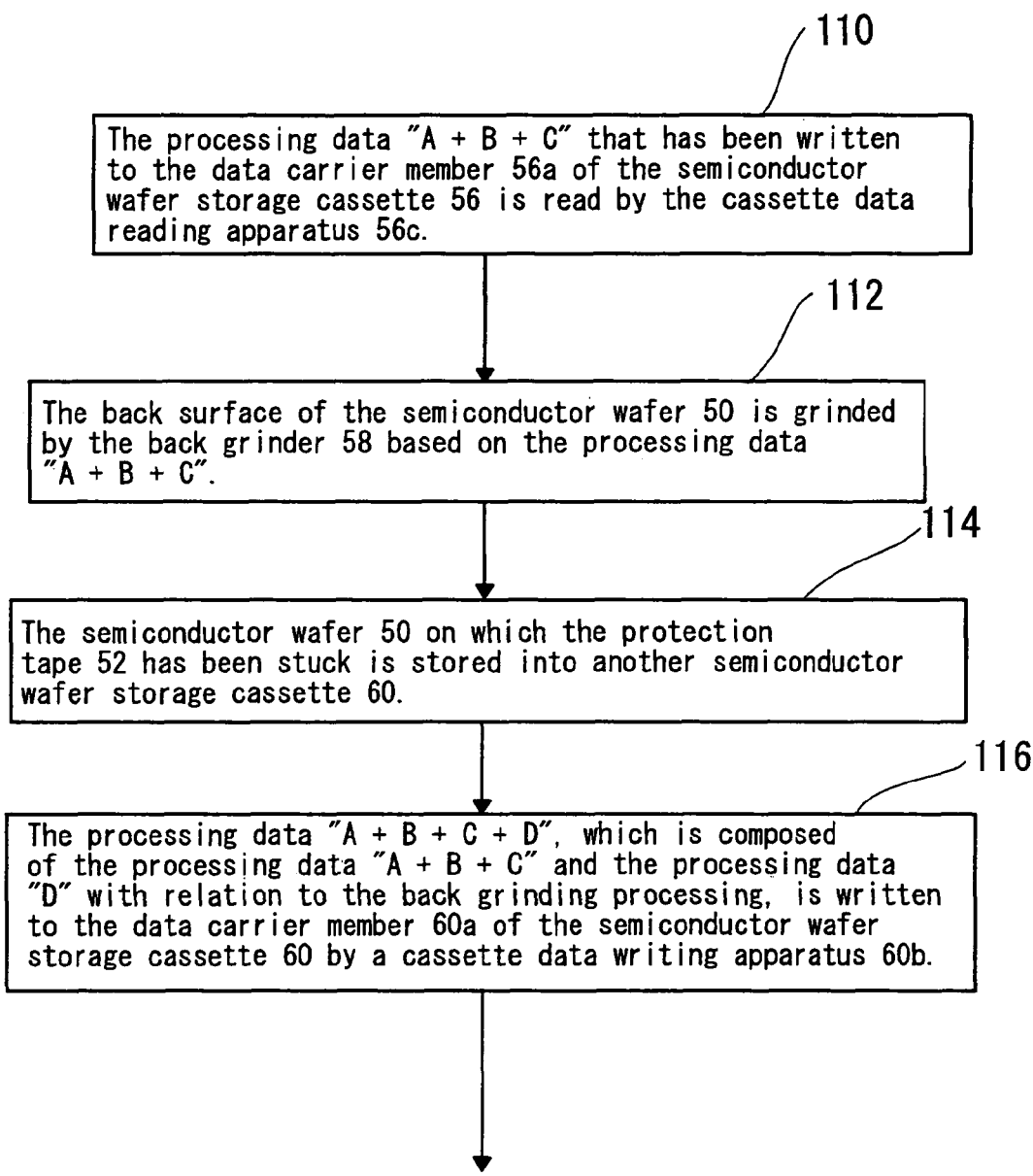

Fig. 16

Wafer mount process

118: The processing data "A + B + C + D" that has been written to the data carrier member 60a of the semiconductor wafer storage cassette 60 is read by the cassette data reading apparatus 60c.

120: The ring frame 66 is stuck through the mount tape 68 to the periphery of the semiconductor wafer 50 by the mount tape sticking apparatus 62 based on the processing data "A + B + C + D".

122: The protection tape 52 is peeled from the circuit surface of the semiconductor wafer 50.

124: The processing data "A + B + C + D + E", which is composed of the processing data "A + B + C + D" and the processing data "E" with relation to the mount tape sticking processing, is written to the data carrier member 66a of the ring frame 66 by a ring frame data writing apparatus 66b.

126: The semiconductor wafer 50 that has been integrated with the ring frame 66 through the mount tape 68 is stored into another semiconductor wafer storage cassette 70.

128: The processing data "A + B + C + D + E", which is composed of the processing data "A + B + C + D" and the processing data "E" with relation to the mount tape sticking processing, is written to the data carrier member 70a of the semiconductor wafer storage cassette 70 by a cassette data writing apparatus 70b.

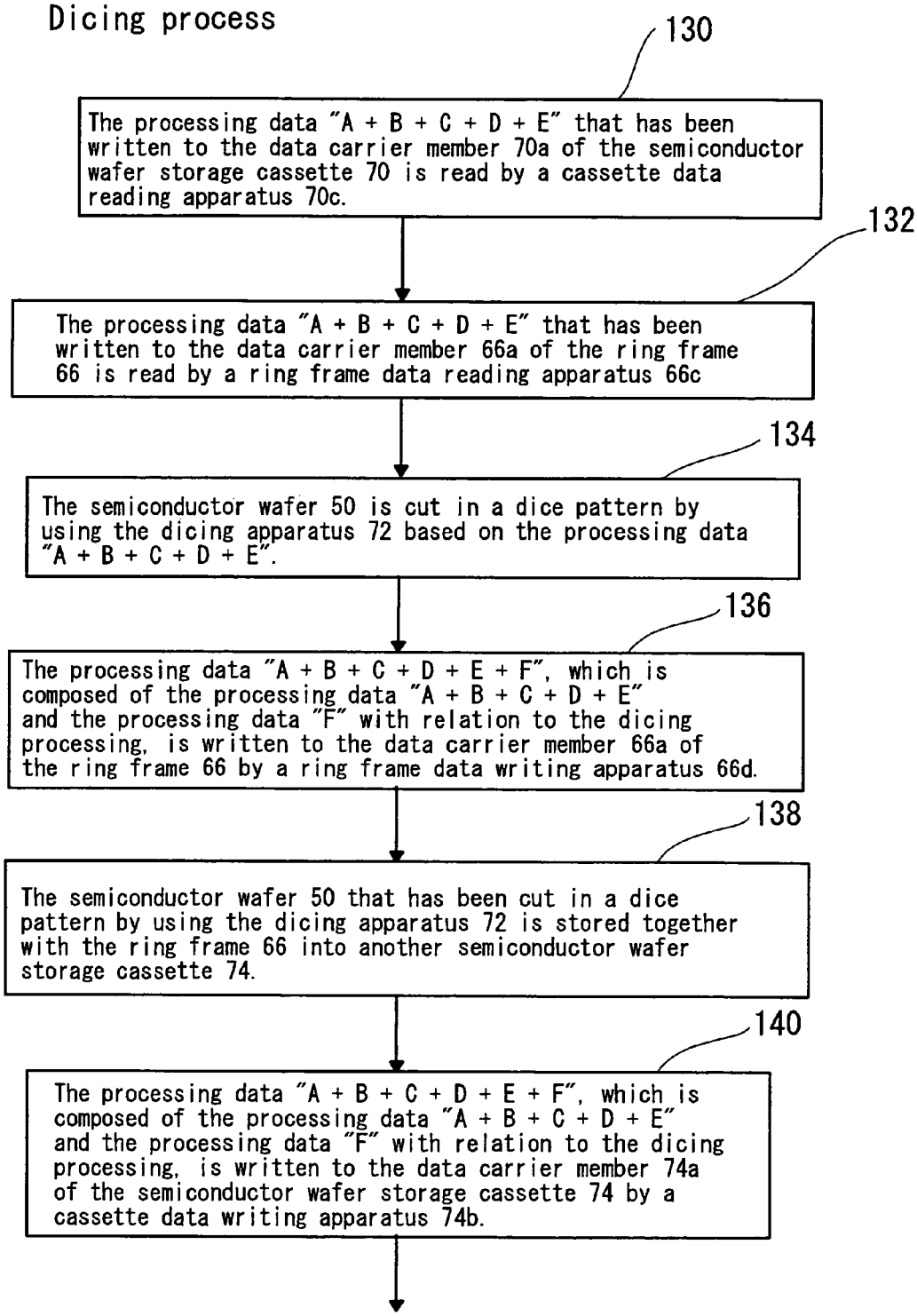

Die bonding process

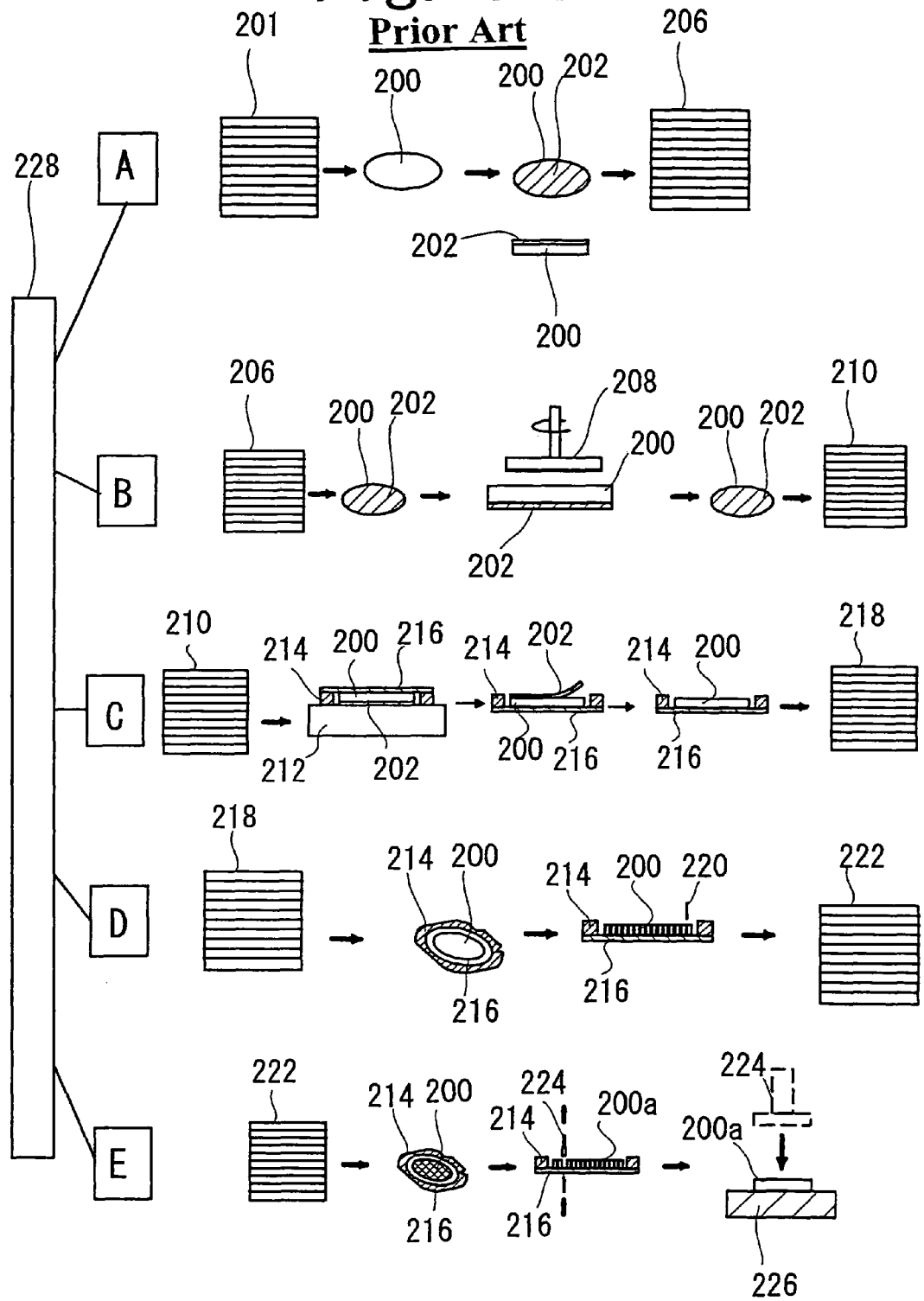

SEMICONDUCTOR WAFER PROCESSING TAPE WINDING BODY, SEMICONDUCTOR WAFER PROCESSING TAPE STICKING APPARATUS AND SEMICONDUCTOR WAFER PROCESSING APPARATUS THAT USE THE SEMICONDUCTOR WAFER PROCESSING TAPE WINDING BODY

TECHNICAL FIELD

The present invention relates to a semiconductor wafer processing tape winding body, a semiconductor wafer processing tape sticking apparatus and a semiconductor wafer processing apparatus that use the semiconductor wafer processing tape winding body.

BACKGROUND ART

As a method for manufacturing a semiconductor by processing a semiconductor wafer, a process shown in FIG. 19 has been adopted conventionally.

That is to say, as shown in FIG. 19(A), a semiconductor wafer 200 on which a circuit has been formed is taken out from a semiconductor wafer storage cassette 201, a protection tape 202 is stuck to the surface of the semiconductor wafer 200 by using a protection tape sticking apparatus (not shown), and the protection tape 202 is cut along the shape of the semiconductor wafer 200.

The semiconductor wafer 200 on which the protection tape 202 has been stuck is then stored into a semiconductor wafer storage cassette 206 (protection tape sticking process).

Next, as shown in FIG. 19(B), the semiconductor wafer 200 is taken out from the semiconductor wafer storage cassette 206, the protection tape 202 side of the semiconductor wafer 200 to which the protection tape 202 has been stuck is sucked and held on a suction table (not shown), and a back surface on which a circuit has not been formed is grinded up to the specified thickness by a back grinder 208.

The semiconductor wafer 200 on which the protection tape 202 has been stuck and of which a back surface has been grinded up to the specified thickness is then stored into a semiconductor wafer storage cassette 210 (back grinding process).

After that, as shown in FIG. 19(C), the semiconductor wafer 200 is taken out from the semiconductor wafer storage cassette 210, the protection tape 202 side of the semiconductor wafer 200 is sucked and held on a suction table 212, and a ring frame 214 is placed on the periphery of the semiconductor wafer 200.

In the above state, a mount tape 216 is stuck to the top surface and then cut along the outline of the ring frame 214 (or a mount tape 216 is cut in advance in such a manner that its outline is equivalent to that of the ring frame 214 and then stuck on the top surface). Consequently, the semiconductor wafer 200 and the ring frame 214 are integrated into one body through the mount tape 216.

As shown in FIG. 19(C), the semiconductor wafer 200 is then inverted upside down together with the ring frame, and the protection tape 202 is peeled from the circuit surface side of the semiconductor wafer 200 by using a peeling tape (not shown).

The semiconductor wafer 200 from which the protection tape 202 has been peeled and that has been integrated with the ring frame 214 through the mount tape 216 is then stored into a semiconductor wafer storage cassette 218 (wafer mounting process).

After that, as shown in FIG. 19(D), the semiconductor wafer 200 is taken out together with the ring frame 214 from the semiconductor wafer storage cassette 218, and the semiconductor wafer 200 is cut in a dice pattern by using a dicing apparatus 220.

The semiconductor wafer 200 that has been cut in a dice pattern by using the dicing apparatus 220 is then stored together with the ring frame 214 into a semiconductor wafer storage cassette 222 (dicing process).

After that, as shown in FIG. 19(E), the semiconductor wafer 200 is taken out together with the ring frame 214 from the semiconductor wafer storage cassette 222, and a semiconductor wafer (chip) 200a that has been cut in a dice pattern is picked up and mounted on the electronic component mounting section of an electronic component 226 by using a bonding apparatus 224 (die bonding process).

As a method for a process control and a quality control in semiconductor manufacturing processes, a bar code method has been adopted conventionally.

That is to say, in the bar code method, a bar code label that corresponds to a serial number marked on the surface of a wafer is stuck on a semiconductor wafer storage cassette, a ring frame, and so on.

In addition, many kinds of information with relation to the wafer are stored in a host computer in such a manner that the information corresponds to the serial number.

In each process of the semiconductor wafer manufacturing processes, information required for the process control is downloaded from the host computer based on the serial number and required processing is executed.

In such a bar code method, however, the information-control host computer must control all of information with relation to the wafer, thus increasing a burden to the host computer.

In general, all processes for wafer processing are not executed in one factory, but wafers are transported from a factory to another factory and wafer processing is continued. All of information with relation to the wafer is stored in the host computer. Consequently, the host computer must be accessed again to download the required information in the factory to which wafers have been transported. As another manner, information that has been stored in the host computer must be stored in an information storage medium, the information storage medium must be transported with the wafers, and the information with relation to the wafer must be stored in a host computer in a factory to which wafers are transported. As a result, the process control becomes complicated.

Japanese Patent Laid-Open Publication No. 2000-331962 (hereinafter "JP '962") describes a wafer processing method in which a data carrier capable of inputting and outputting information in a non-contact manner using electromagnetic waves as a communication medium, such as an RF memory configured by an IC chip and a conductive coil that are connected to each other, is fixed onto a semiconductor wafer support member such as a ring frame or a hard plate for sticking and supporting a semiconductor wafer, required information is read or written, and a wafer is processed by the information read from the data carrier.

However, in the wafer processing method described in JP '962, the data carrier is just fixed onto a semiconductor wafer support member such as a ring frame or a hard plate for sticking and supporting a semiconductor wafer.

Consequently, in the protection tape sticking process as shown in FIG. 19(A), information with relation to the protection tape 202, such as a bar code, a product name, a quality assurance period, and a lot number, which are described on a label that has been stuck to the outer packing member of the protection tape 202 or a label that has been stuck to the shaft member around which the protection tape 202 has been wound, must be separately stored in the host computer 228, thus causing the process control to be complicated.

Moreover, in the case in which the protection tape 202 is stuck to the semiconductor wafer, the information that has been stored in the host computer, such as optimum conditions of a sticking speed and a sticking pressure, must be downloaded from the host computer, thus causing the process control to be complicated.

Furthermore, after the protection tape 202 is stuck to the semiconductor wafer 200, the information with relation to the protection tape 202 must be downloaded from the host computer 228 whenever the processing of the following step is executed, thus causing the process control to be complicated.

Still further, since it is difficult to recognize the kind of the protection tape 202 after the protection tape 202 is stuck to the semiconductor wafer 200, different information may be downloaded from the host computer 228 for executing the processing, thus preventing a semiconductor with a constant level of quality from being manufactured.

Recently, production of many kinds and small lots tends to increase. In such a case, since it is difficult to obtain the information of a remainder amount and a quality assurance period of the protection tape 202 that has been used, thus causing the remainder of the protection tape 202 to run short, the quality assurance period to be exceeded, processes to be interrupted, and quality to be degraded.

Such problems also occur on the mount tape 216 in the wafer mounting process as shown in FIG. 19(C).

The present invention has been made in order to solve the above problems. An object of the present invention is to provide a semiconductor wafer processing tape winding body provided with a data carrier member capable of reading and writing processing data such as tape information for a semiconductor wafer processing tape such as a protection tape and a mount tape.

Moreover, another object of the present invention is to provide a semiconductor wafer processing tape sticking apparatus capable of sticking a semiconductor wafer processing tape to a semiconductor wafer under the optimum conditions based on the processing data that has been written to a data carrier member and that has been read from the data carrier member without accessing the host computer unlike a conventional method, using the above semiconductor wafer processing tape winding body.

Furthermore, another object of the present invention is to provide a semiconductor wafer processing apparatus capable of performing the specified wafer processing under the optimum conditions for a semiconductor wafer to which a semiconductor wafer processing tape is stuck by the semiconductor wafer processing tape sticking apparatus, in particular, a semiconductor wafer grinder, a dicing apparatus, and a die bonding apparatus.

SUMMARY OF THE INVENTION

The present invention has been made in order to solve the problems and to achieve the objects described above, and provides a semiconductor wafer processing tape winding body comprising:

a semiconductor wafer processing tape for processing a semiconductor wafer by being stuck to the semiconductor wafer, a shaft member for winding the semiconductor wafer processing tape, and a data carrier member being formed in the shaft member and capable of reading and writing desired processing data.

By the above configuration, the information of a product name, a quality assurance period, a length of a tape, a width of a tape, a lot number, and a sticking pressure and a sticking speed that are optimum for a semiconductor wafer, etc, can be written to the data carrier member formed in the shaft member.

As a result, in the case in which the semiconductor wafer processing tape that has been wound around the semiconductor wafer processing tape winding body is stuck to the semiconductor wafer to process the semiconductor wafer, the processing data that has been written to the data carrier member can be read without accessing to the host computer unlike a conventional method, and the semiconductor wafer processing tape can be stuck to the semiconductor wafer under the optimum conditions based on the read processing data.

Consequently, such information of the semiconductor wafer processing tape is not required to be separately stored in the host computer, and the information stored in the host computer is not required to be downloaded during wafer processing, thus enabling many kinds of wafer processing to be executed and simplifying process control.

Moreover, the information of a remainder amount and a quality assurance period of the semiconductor wafer processing tape that has been used is written to the data carrier member formed in the shaft member and is read during wafer processing, thus preventing the semiconductor wafer processing tape from running short, the quality assurance period from being exceeded, processes from being interrupted, and quality from being degraded.

Moreover, the semiconductor wafer processing tape winding body related to the present invention is characterized in that the data carrier member is a non-contact type data carrier member.

Furthermore, the semiconductor wafer processing tape winding body related to the present invention is characterized in that the non-contact type data carrier member is an RF memory that is configured by an IC chip and a conductive coil connected to the IC chip.

By the above configuration in which the data carrier member formed in the shaft member is a non-contact type data carrier member, in particular, is an RF memory that is configured by an IC chip and a conductive coil connected to the IC chip, writing and reading of the information with relation to the semiconductor wafer processing tape can be executed quickly and reliably, processes can be shortened, wafer processing can be precisely performed, and the quality of a semiconductor product can be prevented from being degraded.

Still further, the semiconductor wafer processing tape winding body related to the present invention is characterized in that the data carrier member is formed on the surface of the shaft member.

By the above configuration in which the data carrier member is formed on the surface of the shaft member, writing and reading of the information with relation to the semiconductor wafer processing tape can be executed quickly and reliably, processes can be shortened, wafer processing can be precisely performed, and the quality of a semiconductor product can be prevented from being degraded.

Still further, the semiconductor wafer processing tape winding body related to the present invention is characterized in that the data carrier member is buried in the shaft member.

By the above configuration in which the data carrier member is buried in the shaft member, in the case in which the semiconductor wafer processing tape is wound around the shaft member, the data carrier member does not disturb the winding operation, the semiconductor wafer processing tape is not unevenly wound, and the data carrier member is not damaged or broken.

In addition, in the case in which the shaft member is attached to or detached from the feeding shaft of the feeding apparatus, the data carrier member does not disturb the attaching and detaching operations, and the data carrier member is not damaged or broken.

Still further, the semiconductor wafer processing tape winding body related to the present invention is characterized in that the data carrier member is formed on the internal surface of the shaft member.

By the above configuration in which the data carrier member is formed on the internal surface of the shaft member, in the case in which the semiconductor wafer processing tape is wound around the shaft member, the data carrier member does not disturb the winding operation, the semiconductor wafer processing tape is not unevenly wound, and the data carrier member is not damaged or broken.

In addition, in the case in which a read/write device is formed in the feeding shaft of the feeding apparatus and the shaft member is attached to or detached from the feeding shaft, the information of the data carrier member can be read or written. Moreover, the information of a remainder amount and a quality assurance period of the semiconductor wafer processing tape that has been used is written to the data carrier member formed in the shaft member and is read during wafer processing, thus preventing the semiconductor wafer processing tape from running short, the quality assurance period from being exceeded, processes from being interrupted, and quality from being degraded.

Still further, the semiconductor wafer processing tape winding body related to the present invention is characterized in that the data carrier member is formed on the external surface of the shaft member.

By the above configuration in which the data carrier member is formed on the external surface of the shaft member, electromagnetic waves are not interrupted even in the case in which the shaft member is made of any material, writing and reading of the information with relation to the semiconductor wafer processing tape can be executed quickly and reliably, processes can be shortened, wafer processing can be precisely performed, and the quality of a semiconductor product can be prevented from being degraded.

Furthermore, a semiconductor wafer processing tape sticking apparatus related to the present invention is characterized by comprising:

a feeding apparatus provided with a feeding shaft to which the semiconductor wafer processing tape winding body as defined in any one of the above descriptions can be detachably attached, a tape data read/write device for reading and writing the processing data that has been written to the data carrier member of the semiconductor wafer processing tape winding body, and a tape sticking apparatus for sticking a semiconductor wafer processing tape that has been fed out from the feeding apparatus to the semiconductor wafer based on the processing data that has been read by the tape data read/write device.

By the above configuration, the information of a product name, a quality assurance period, a length of a tape, a width of a tape, a lot number, and a sticking pressure and a sticking speed that are optimum for a semiconductor wafer, etc, which has been written to the data carrier member formed in the shaft member of the semiconductor wafer processing tape winding body, can be read by the tape data read/write device.

A semiconductor wafer processing tape that has been fed out from the feeding apparatus can then be stuck to the semiconductor wafer by the tape sticking apparatus based on the processing data that has been read by the tape data read/write device.

Consequently, the processing data that has been written to the data carrier member is read by the tape data read/write device without accessing to the host computer unlike a conventional method, and the semiconductor wafer processing tape can be stuck to the semiconductor wafer under the optimum conditions based on the read processing data.

Accordingly, such information of the semiconductor wafer processing tape is not required to be separately stored in the host computer, and the information stored in the host computer is not required to be downloaded during wafer processing, thus enabling many kinds of wafer processing to be executed and simplifying process control.

Moreover, the information of a remainder amount and a quality assurance period of the semiconductor wafer processing tape that has been used is written to the data carrier member formed in the shaft member and is read during wafer processing by the tape data read/write device, thus preventing the semiconductor wafer processing tape from running short, a quality assurance period from being exceeded, processes from being interrupted, and quality from being degraded.

Moreover, the semiconductor wafer processing tape sticking apparatus related to the present invention is characterized in that the tape data read/write device is formed in the feeding shaft.

By the above configuration, in the case in which the semiconductor wafer processing tape winding body is attached to the feeding shaft of the feeding apparatus, the information of a product name, a quality assurance period, a length of a tape, a width of a tape, a lot number, and a sticking pressure and a sticking speed that are optimum for a semiconductor wafer, etc, which has been written to the data carrier member formed in the shaft member of the semiconductor wafer processing tape winding body, can be read quickly and reliably by the tape data read/write device.

Moreover, the information of a remainder amount and a quality assurance period of the semiconductor wafer processing tape that has been used can be written to the data carrier member formed in the shaft member quickly and reliably by the tape data read/write device, and the semiconductor wafer processing tape winding body can be detached from the feeding shaft of the feeding apparatus.

Furthermore, the semiconductor wafer processing tape sticking apparatus related to the present invention is characterized by further comprising a cassette data writing apparatus for writing desired processing data to a data carrier member formed in a semiconductor wafer storage cassette, wherein the semiconductor wafer storage cassette stores the semiconductor wafer to which the semiconductor wafer processing tape has been stuck by the tape sticking apparatus.

By the above configuration, many kinds of information in the case in which the semiconductor wafer processing tape has been stuck by the tape sticking apparatus, such as a product name, a quality assurance period, a lot number, a sticking pressure, and a sticking speed for the semiconductor wafer processing tape, and a kind and a thickness of the semiconductor wafer, can be written to the data carrier member formed in the semiconductor wafer storage cassette by the cassette data writing apparatus.

As a result, in the case in which the semiconductor wafer is processed in the following process, the processing data that has been written to the data carrier member formed in the semiconductor wafer storage cassette is read without accessing to the host computer unlike a conventional method, and the semiconductor wafer can be processed under the optimum conditions based on the read processing data.

Still further, the semiconductor wafer processing tape sticking apparatus related to the present invention is characterized in that the semiconductor wafer processing tape sticking apparatus is a protection tape sticking apparatus for sticking a protection tape that protects a circuit surface of the semiconductor wafer.

By the above configuration, the processing data that has been written to the data carrier member of the semiconductor wafer processing tape winding body can be read by the tape data read/write device, and the protection tape for protecting a circuit surface of a semiconductor wafer can be stuck to the circuit surface of the semiconductor wafer under the optimum conditions by the protection tape sticking apparatus based on the read processing data.

Still further, the semiconductor wafer processing tape sticking apparatus related to the present invention is characterized in that the semiconductor wafer processing tape sticking apparatus is a mount tape sticking apparatus for sticking a mount tape that stucks a ring frame to the periphery of the semiconductor wafer.

By the above configuration, the processing data that has been written to the data carrier member of the semiconductor wafer processing tape winding body can be read by the tape data read/write device, and the ring frame can be stuck to the periphery of the semiconductor wafer through a mount tape under the optimum conditions based on the read processing data.

Still further, the semiconductor wafer processing tape sticking apparatus related to the present invention is characterized by further comprising a ring frame data writing apparatus for writing desired processing data to a data carrier member formed in the ring frame.

By the above configuration, many kinds of information in the case in which the semiconductor wafer processing tape has been stuck by the tape sticking apparatus, such as a product name, a quality assurance period, a lot number, a sticking pressure, and a sticking speed for the semiconductor wafer processing tape, and a kind and a thickness of the semiconductor wafer, can be written to the data carrier member formed in the ring frame by the ring frame data writing apparatus.

As a result, in the case in which the semiconductor wafer is processed in the following process, the processing data that has been written to the data carrier member formed in the ring frame can be read without accessing to the host computer unlike a conventional method, and the semiconductor wafer can be processed one by one under the optimum conditions based on the read processing data.

A semiconductor wafer processing tape sticking apparatus related to the present invention is characterized by further comprising a cassette data reading apparatus for reading the processing data that has been written to the data carrier member formed in a semiconductor wafer storage cassette that stores a semiconductor wafer to which the specified processing has been performed in the preceding process, wherein a semiconductor wafer processing tape is stuck to the semiconductor wafer by the tape sticking apparatus based on the processing data that has been read by the cassette data reading apparatus and the processing data that has been read by the tape data read/write device.

By the above configuration, the processing data for wafer processing in the preceding process, such as a product name, a quality assurance period, a lot number, a sticking pressure, and a sticking speed for the semiconductor wafer processing tape, a kind and a thickness of the semiconductor wafer, and processing conditions in the preceding process, can be read from the data carrier member formed in the semiconductor wafer storage cassette by the cassette data reading apparatus.

In addition, the information of a product name, a quality assurance period, a length of a tape, a width of a tape, a lot number, and a sticking pressure and a sticking speed that are optimum for a semiconductor wafer, etc, which has been written to the data carrier member formed in the shaft member of the semiconductor wafer processing tape winding body, can be read by the tape data read/write device.

Moreover, without accessing to the host computer unlike a conventional method, the semiconductor wafer processing tape can be stuck to the semiconductor wafer under the optimum conditions based on the read processing data.

A semiconductor wafer processing apparatus related to the present invention is characterized in that the specified wafer processing is performed to the semiconductor wafer to which the semiconductor wafer processing tape has been stuck by the semiconductor wafer processing tape sticking apparatus as defined in any one of the above descriptions based on the processing data that has been written to the data carrier member formed in the semiconductor wafer storage cassette that stores the semiconductor wafer to which the semiconductor wafer processing tape has been stuck by the tape sticking apparatus.

By the above configuration, many kinds of information in the case in which the semiconductor wafer processing tape has been stuck by the tape sticking apparatus, such as a product name, a quality assurance period, a lot number, a sticking pressure, and a sticking speed for the semiconductor wafer processing tape, and a kind and a thickness of the semiconductor wafer, can be written to the data carrier member formed in the semiconductor wafer storage cassette.

As a result, in the case in which the semiconductor wafer is processed in the following process, the processing data that has been written to the data carrier member formed in the semiconductor wafer storage cassette can be read without accessing to the host computer unlike a conventional method, and the semiconductor wafer can be processed under the optimum conditions based on the read processing data.

A semiconductor wafer processing apparatus related to the present invention is characterized in that the specified wafer processing is performed to the semiconductor wafer to which the semiconductor wafer processing tape has been stuck by the semiconductor wafer processing tape sticking apparatus as defined in any one of the above descriptions based on the processing data that has been written to the data carrier member formed in the ring frame.

By the above configuration, many kinds of information in the case in which the semiconductor wafer processing tape has been stuck by the tape sticking apparatus, such as a product name, a quality assurance period, a lot number, a sticking pressure, and a sticking speed for the semiconductor wafer processing tape, and a kind and a thickness of the semiconductor wafer, can be written to the data carrier member formed in the ring frame.

As a result, in the case in which the semiconductor wafer is processed in the following process, the processing data that has been written to the data carrier member formed in the ring frame can be read without accessing to the host computer unlike a conventional method, and the semiconductor wafer can be processed one by one under the optimum conditions based on the read processing data.

A semiconductor wafer processing apparatus related to the present invention is characterized in that the semiconductor wafer processing apparatus is a semiconductor wafer grinder for grinding the back surface opposite to the circuit surface of the semiconductor wafer.

By the above configuration, many kinds of information, such as a product name, a quality assurance period, a lot number, a sticking pressure, and a sticking speed for a protection tape that protects a circuit surface as the semiconductor wafer processing tape, and a kind and a thickness of the semiconductor wafer, can be written to the data carrier member formed in the semiconductor wafer storage cassette.

As a result, in the case in which the back surface opposite to the circuit surface of the semiconductor wafer is grinded, the processing data that has been written to the data carrier member formed in the semiconductor wafer storage cassette can be read without accessing to the host computer unlike a conventional method, and the back surface of the semiconductor wafer can be grinded by the semiconductor wafer grinder under the optimum conditions based on the read processing data.

A semiconductor wafer processing apparatus related to the present invention is characterized in that the semiconductor wafer processing apparatus is a dicing apparatus for cutting the semiconductor wafer in a dice pattern.

By the above configuration, many kinds of information, such as a product name, a quality assurance period, a lot number, a sticking pressure, and a sticking speed for a mount tape that sticks a ring frame to the periphery of the semiconductor wafer as the semiconductor wafer processing tape, and a kind and a thickness of the semiconductor wafer, can be written to the data carrier member formed in the semiconductor wafer storage cassette.

As a result, in the case in which the semiconductor wafer is cut in a dice pattern, the processing data that has been written to the data carrier member formed in the semiconductor wafer storage cassette can be read without accessing to the host computer unlike a conventional method, and the semiconductor wafer can be cut in a dice pattern by the dicing apparatus under the optimum conditions based on the read processing data.

A semiconductor wafer processing apparatus related to the present invention is characterized in that the semiconductor wafer processing apparatus is a die bonding apparatus for picking up a semiconductor chip that has been cut in a dice pattern and mounting the semiconductor chip on the electronic component mounting section of an electronic component.

By the above configuration, many kinds of information, such as a product name, a quality assurance period, a lot number, a sticking pressure, and a sticking speed for a mount tape that sticks a ring frame to the periphery of the semiconductor wafer as the semiconductor wafer processing tape, and a kind and a thickness of the semiconductor wafer, can be written to the data carrier member formed in the semiconductor wafer storage cassette.

As a result, in the case in which a semiconductor chip that has been cut in a dice pattern is picked up and mounted on the electronic component mounting section of an electronic component, the processing data that has been written to the data carrier member formed in the semiconductor wafer storage cassette can be read without accessing to the host computer unlike a conventional method, and the semiconductor chip that has been cut in a dice pattern can be picked up and mounted on the electronic component mounting section of an electronic component by the die bonding apparatus under the optimum conditions based on the read processing data.

According to the present invention, the information of a product name, a quality assurance period, a length of a tape, a width of a tape, a lot number, and a sticking pressure and a sticking speed that are optimum for a semiconductor wafer, etc, can be written to the data carrier member formed in the shaft member.

As a result, in the case in which the semiconductor wafer processing tape that has been wound around the semiconductor wafer processing tape winding body is stuck to the semiconductor wafer to process the semiconductor wafer, the processing data that has been written to the data carrier member can be read without accessing to the host computer unlike a conventional method, and the semiconductor wafer processing tape can be stuck to the semiconductor wafer under the optimum conditions based on the read processing data.

Accordingly, such information of the semiconductor wafer processing tape is not required to be separately stored in the host computer, and the information stored in the host computer is not required to be downloaded from the host computer during wafer processing, thus enabling many kinds of wafer processing to be executed and simplifying process control.

Moreover, the information of a remainder amount and a quality assurance period of the semiconductor wafer processing tape that has been used is written to the data carrier member formed in the shaft member and is read during wafer processing, thus preventing the semiconductor wafer processing tape from running short, the quality assurance period from being exceeded, processes from being interrupted, and quality from being degraded.

BRIEF DESCRIPTION OF THE DRAWINGS

FIG. 11 is a schematic view for illustrating a wafer mount process of a semiconductor wafer processing method.

FIG. 12 is a schematic view for illustrating a dicing process of a semiconductor wafer processing method.

FIG. 13 is a schematic view for illustrating a die bonding process of a semiconductor wafer processing method.

FIG. 14 is a flowchart for describing a protection tape sticking process of a semiconductor wafer processing method.

FIG. 15 is a flowchart for describing a back grinding process of a semiconductor wafer processing method.

FIG. 16 is a flowchart for describing a wafer mount process of a semiconductor wafer processing method.

FIG. 17 is a flowchart for describing a dicing process of a semiconductor wafer processing method.

FIG. 19 is a schematic view illustrating a conventional semiconductor wafer processing method.

BEST MODE OF CARRYING OUT THE INVENTION

An embodiment (example) of the present invention will be described below in detail with reference to the drawings.

Figure 1:
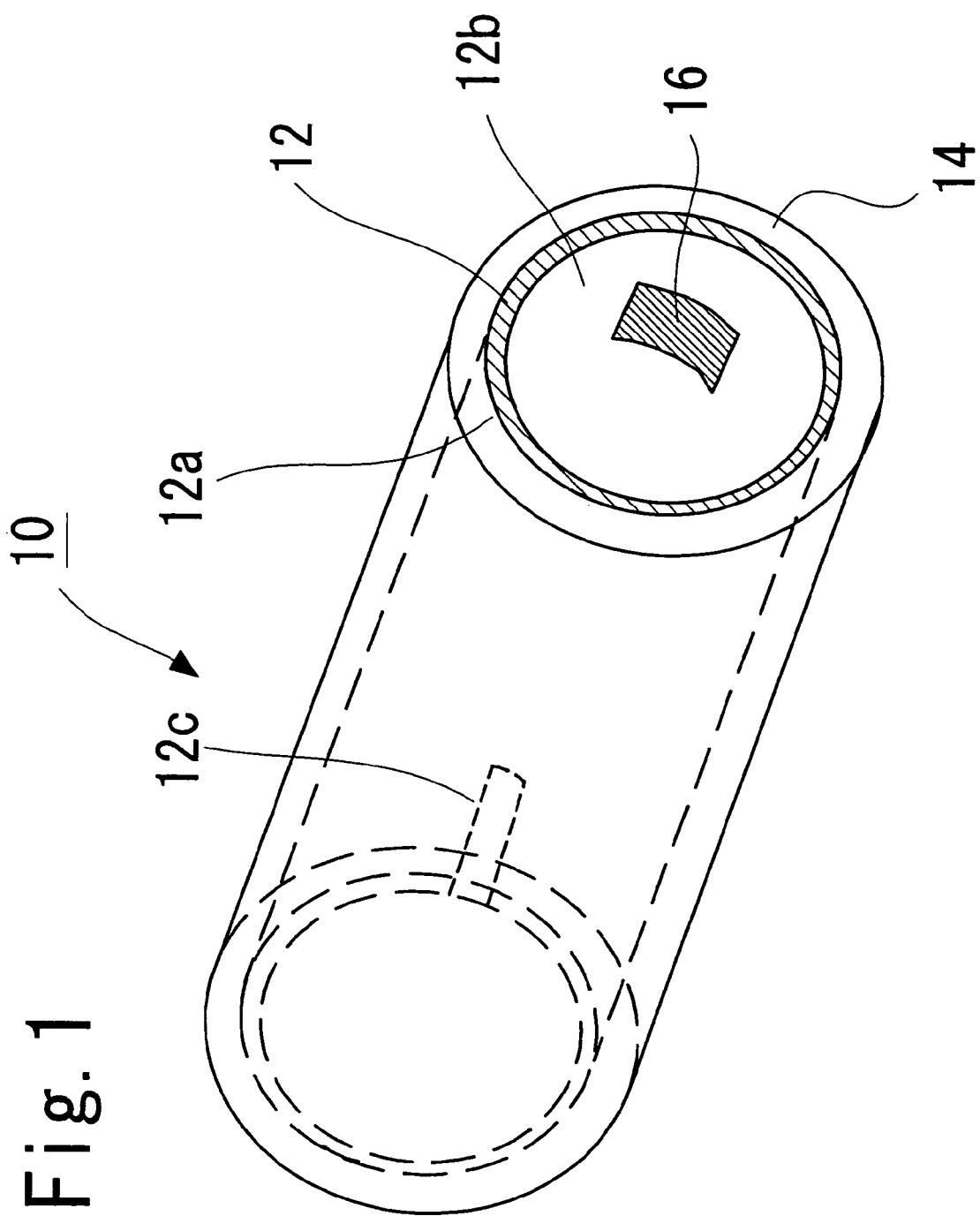
FIG. 1 is a schematic perspective view showing an embodiment of the semiconductor wafer processing tape winding body 10 related to the present invention.

FIG. 1 is a schematic perspective view showing an embodiment of a semiconductor wafer processing tape winding body related to the present invention.

In FIG. 1, the reference numeral 10 shows a semiconductor wafer processing tape winding body related to the present invention as a whole.

As shown in FIG. 1, a semiconductor wafer processing tape winding body 10 is provided with an almost cylindrically shaped shaft member 12, and a semiconductor wafer processing tape 14 is wound on the external surface 12a of the shaft member 12.

The semiconductor wafer processing tape 14 is stuck to a semiconductor wafer to perform many kinds of processing of the semiconductor wafer. Such a tape which is used for many kinds of semiconductor wafer processing is, for instance, a protection tape for protecting the circuit surface of the semiconductor wafer in the case in which the back surface of the semiconductor wafer is grinded, or a mount tape for sticking a ring frame to the periphery of the semiconductor wafer. Such tapes are not restricted in particular.

As such a semiconductor wafer processing tape 14, a tape in which the energy ray curable adhesive such as acrylic energy ray curable adhesive has been formed on the surface of the substrate can be used as described in Japanese Patent Laid-Open Publication Nos. SHO 60 (1985)-196956, SHO 60 (1985)-223139, HEI 5 (1993)-32946, and HEI 8 (1996)-27239.

The material of the shaft member 12 is not restricted in particular. For instance, synthetic resin such as polyethylene resin, polypropylene resin, and ABS resin can be used.

For the semiconductor wafer processing tape winding body 10 related to the present embodiment, a data carrier member 16 is formed on the edge of an internal surface 12b of the shaft member 12.

In this case, the data carrier member 16 is provided with a storage section capable of reading and writing desired processing data.

As the data carrier member 16, it is preferable to use a non-contact type data carrier capable of reading and writing information in a non-contact manner using electromagnetic waves as a communication medium. As the non-contact type data carrier member 16, it is possible to use an RF memory configured by an IC chip and a conductive coil for transmitting/receiving data that is connected to the IC chip.

Figure 2:
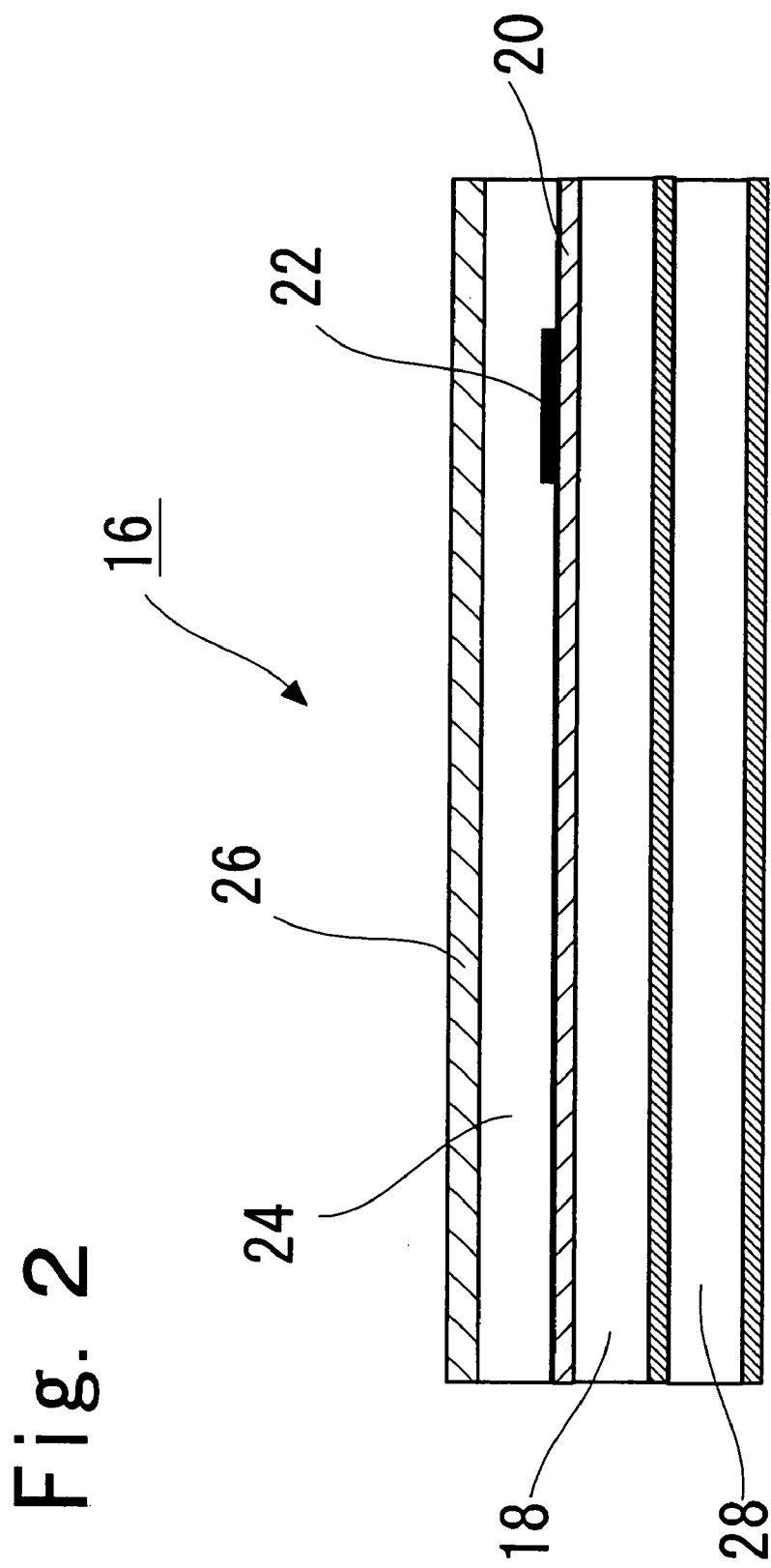
FIG. 2 is a cross-sectional view showing the structure of the data carrier member 16.

In this case, as the structure of the data carrier member 16, a sticking label type structure can be adopted as shown in FIG. 2.

That is to say, a circuit 20 is printed with conductive ink on the surface of a substrate 18 for a circuit such as polyethylene terephthalate, and an IC chip 22 is mounted on the circuit 20. A surface substrate 24 such as polyethylene terephthalate is then stuck on the circuit 20, and a printing coat layer 26 capable of thermal transfer printing is formed on the face stock 24. In addition, an adhesive double coated tape 28 in which a core material is made of polyethylene terephthalate, etc., is formed on the back surface of the substrate 18 for a circuit.

By the above configuration, the data carrier member 16 can be stuck on the internal surface 12b of the shaft member 12.

In this case, information that is read from or written to the data carrier member 16 is not restricted in particular. For instance, the information of a product name, a quality assurance period, a length of a tape, a width of a tape, a lot number, and a sticking pressure and a sticking speed that are optimum for a semiconductor wafer, etc., can be used.

Like a conventional manner, the above data and a bar code can also be printed on the printing coat layer 26 of the data carrier member 16.

Figure 3:
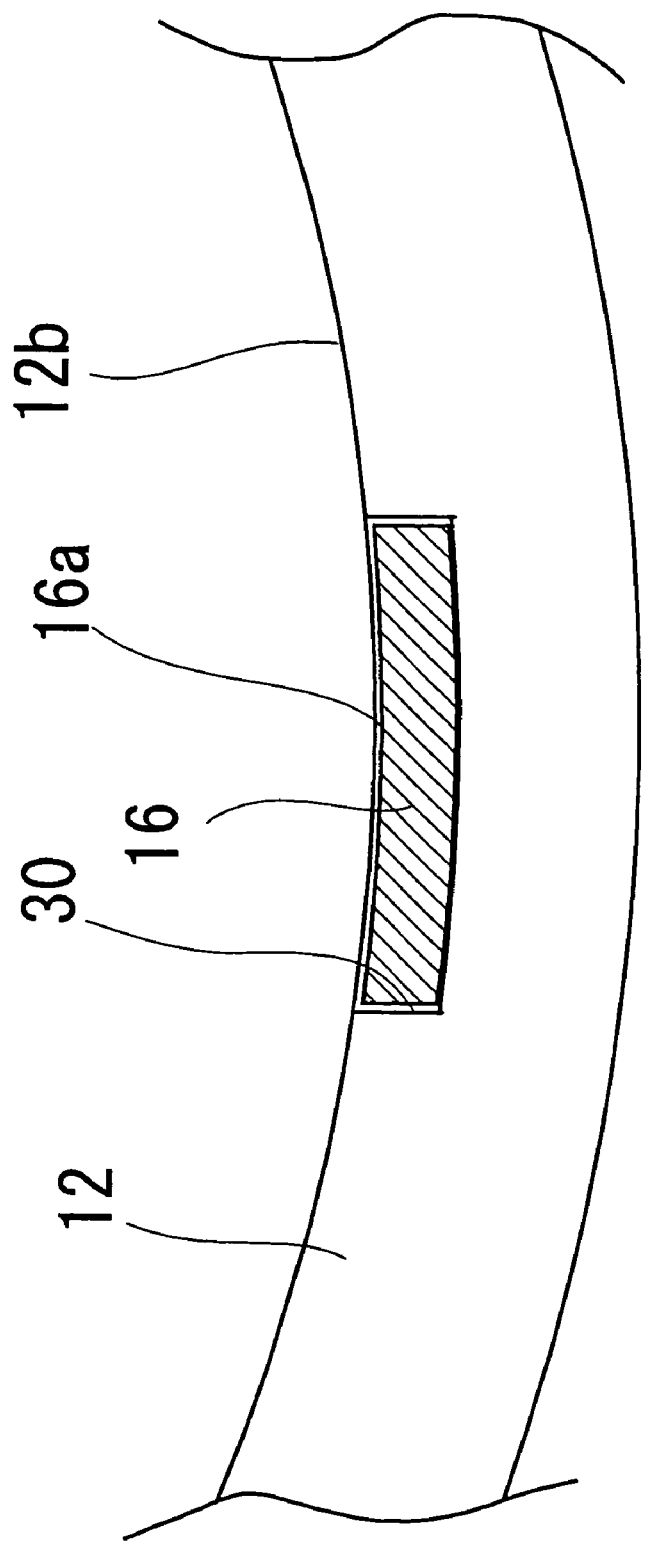
FIG. 3 is a partially expanded view illustrating a method for forming the data carrier member 16 in the shaft member 12.

In the case in which the data carrier member 16 is formed on the internal surface of the shaft member 12, as shown in FIG. 3, a mounting depression 30 for mounting the data carrier member 16 can be formed in the internal surface 12b of the shaft member 12, and the data carrier member 16 can be stuck and buried in the mounting depression 30 in the shaft member 12.

In the case in which the data carrier member 16 is stuck and buried in the mounting depression 30, as shown in FIG. 3, it is preferable that a surface 16a of the data carrier member 16 and the internal surface 12b of the shaft member 12 are on the same plane or the surface 16a of the data carrier member 16 is slightly lower than the internal surface 12b of the shaft member 12. By such a configuration, in the case in which the shaft member 12 is attached to or detached from a feeding shaft 34 of a feeding apparatus 32 as described later, the attaching and detaching operations are not disturbed and the data carrier member is not damaged or broken.

A method for forming the data carrier member 16 on the internal surface 12b of the shaft member 12 is not restricted to the method of using such a sticking label type structure.

Figure 4:
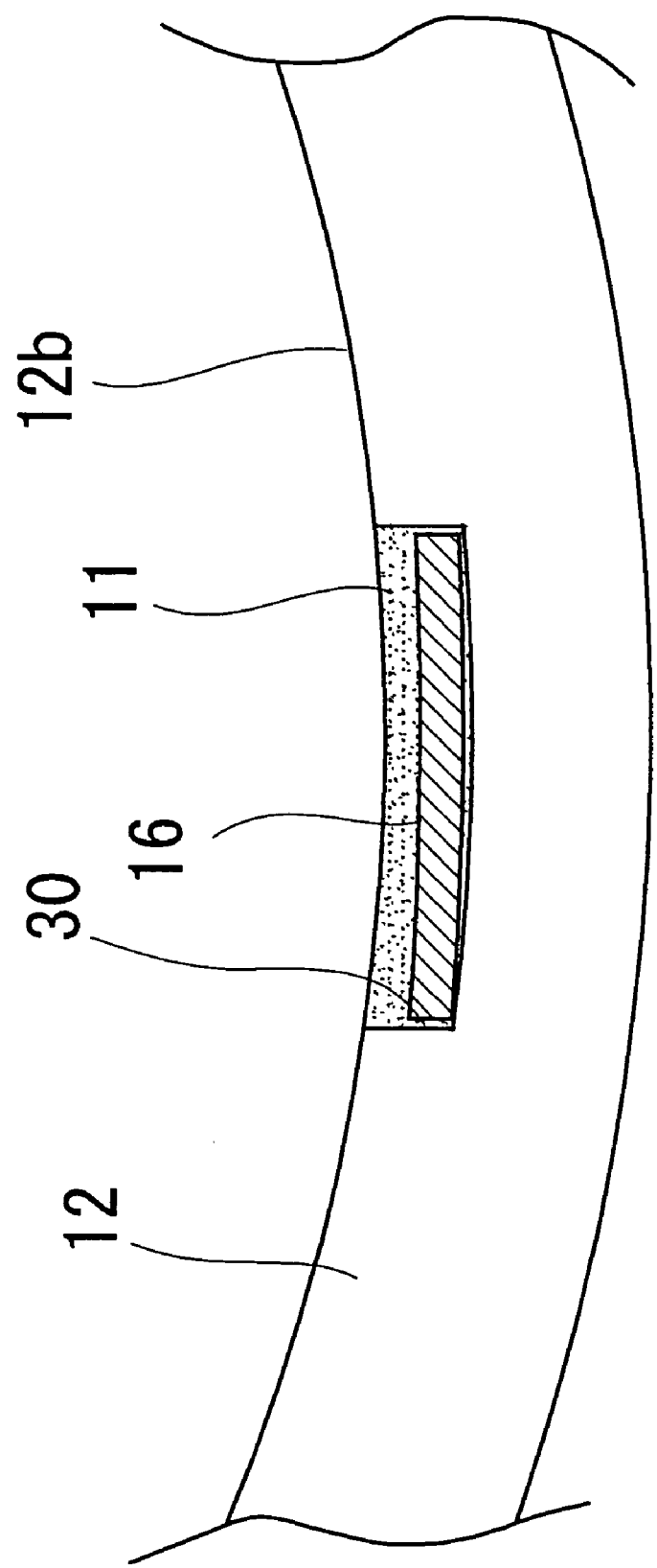
FIG. 4 is a partially expanded view illustrating a method for forming the data carrier member 16 in the shaft member 12.

As shown in FIG. 4, for instance, after the data carrier member 16 is arranged in the mounting depression 30 formed in the internal surface 12b of the shaft member 12, the data carrier member 16 can be buried in the depression by sealing the upper surface of the data carrier member with synthetic resin 11. In addition, the shaft member 12 and the data carrier member 16 can also be formed in one body (not shown).

Figure 5:
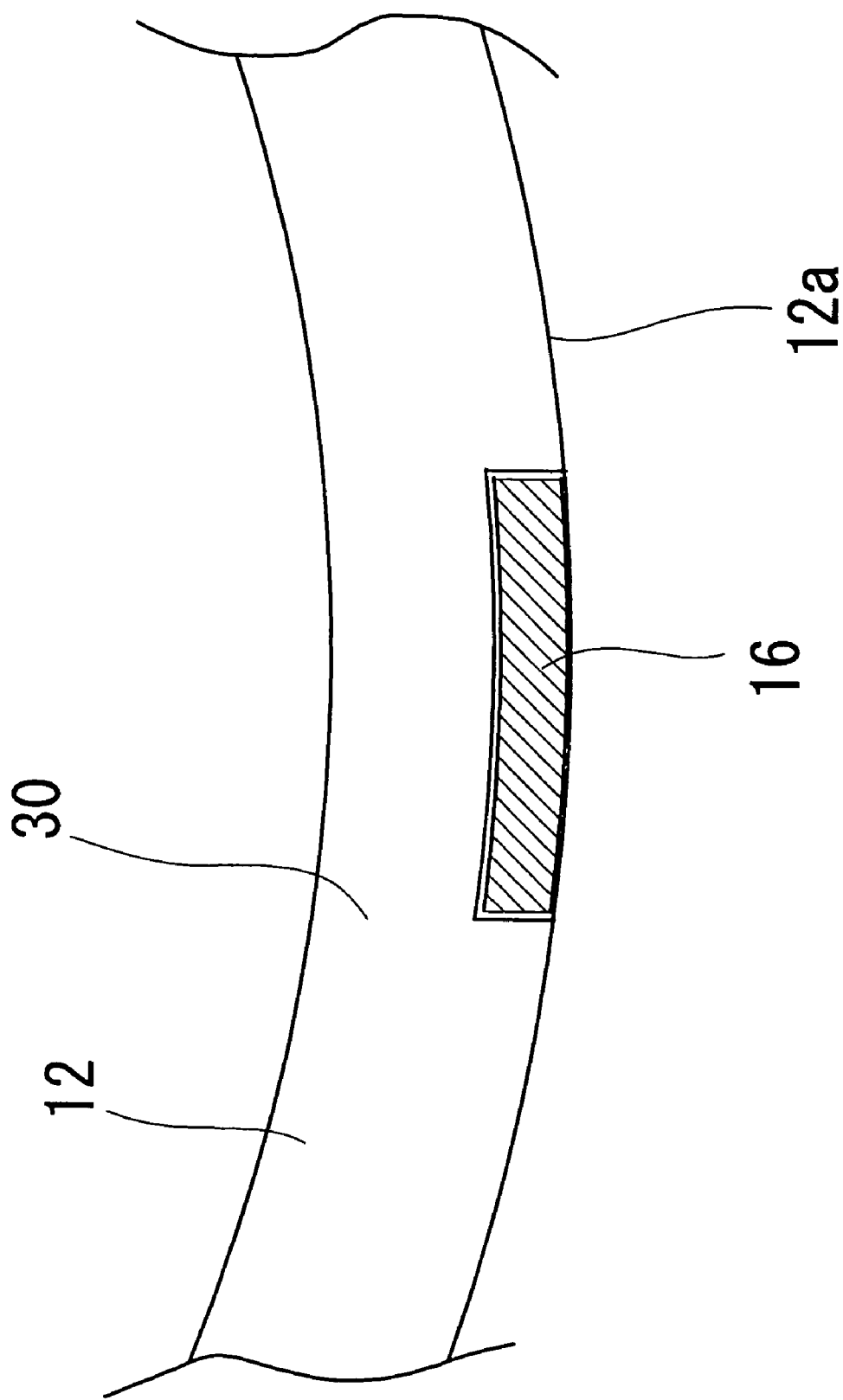
FIG. 5 is a partially expanded view illustrating a method for forming the data carrier member 16 in the shaft member 12.

A place where the data carrier member 16 is formed is not restricted in particular. Although the data carrier member 16 is formed on the edge of the internal surface 12b of the shaft member 12 in the present embodiment, forming at the center of the internal surface 12b of the shaft member 12 can also be possible. As shown in FIG. 5, the data carrier member 16 can also be formed on the external surface 12a of the shaft member 12. Moreover, the data carrier member 16 can also be formed on both the external surface 12a and the internal surface 12b of the shaft member 12. Even in such a case, a method for forming the data carrier member 16 is not restricted to a method of using the above described sticking label type structure.

As shown in FIG. 1, the shaft member 12 of the semiconductor wafer processing tape winding body 10 is provided with an alignment section 12c. The alignment section 12c is formed for accurately aligning a tape data read/write device 36 and the data carrier member 16 formed on the internal surface of the shaft member 12 in the case in which the shaft member 12 is attached to the feeding shaft 34 of the feeding apparatus 32 as described later.

In such a case, the alignment section 12c can be a projection rib slightly protruded or a cut section both which is formed on the external surface 12a or at the edge of the shaft member 12. A marking that is used for alignment can also be adopted. The arrangement and shape of the alignment section 12c are not restricted in particular.

Thus configured semiconductor wafer processing tape winding body 10 is used with the feeding apparatus shown in FIGS. 6 and 7 as follows.

Figure 6:
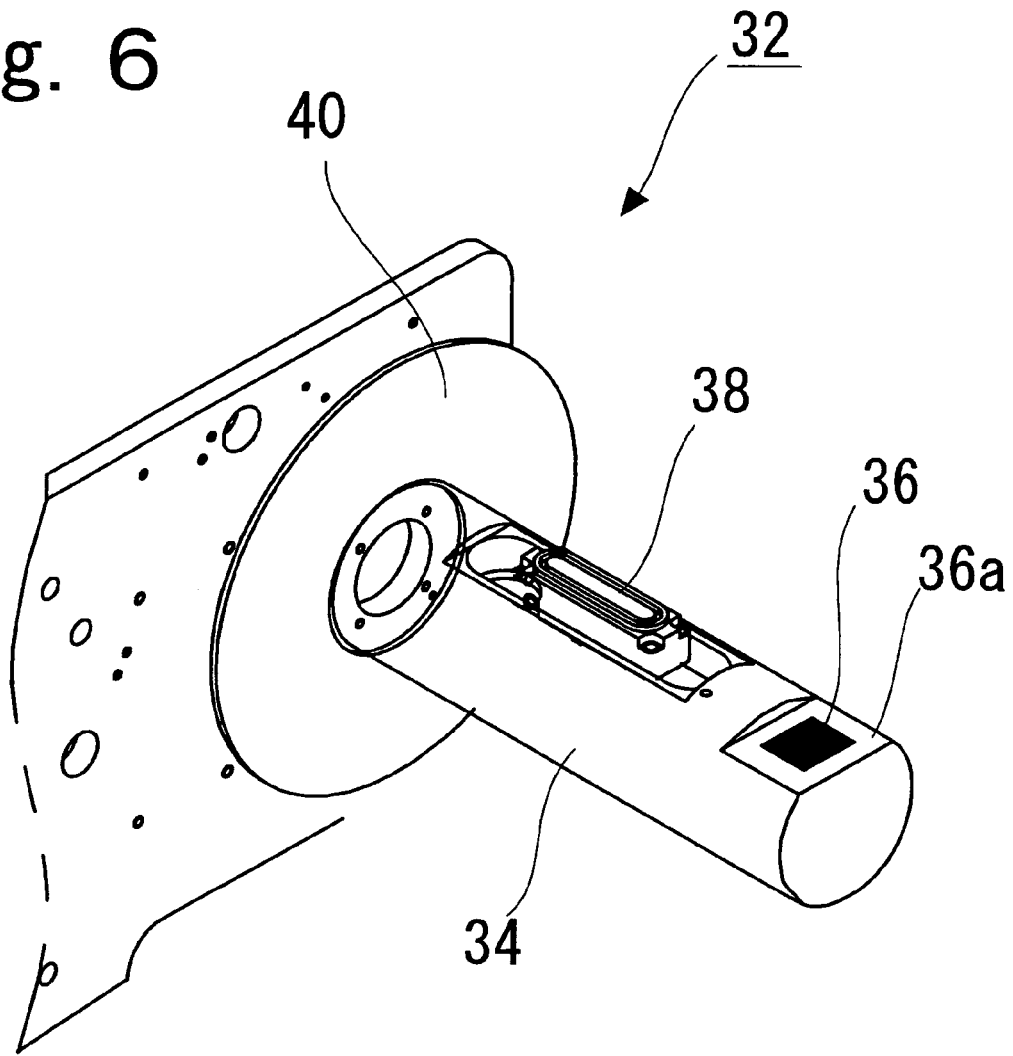
FIG. 6 is a perspective view showing a part of a feeding apparatus in a semiconductor wafer processing tape sticking apparatus using a semiconductor wafer processing tape winding body shown in FIG. 1.
Figure 7:
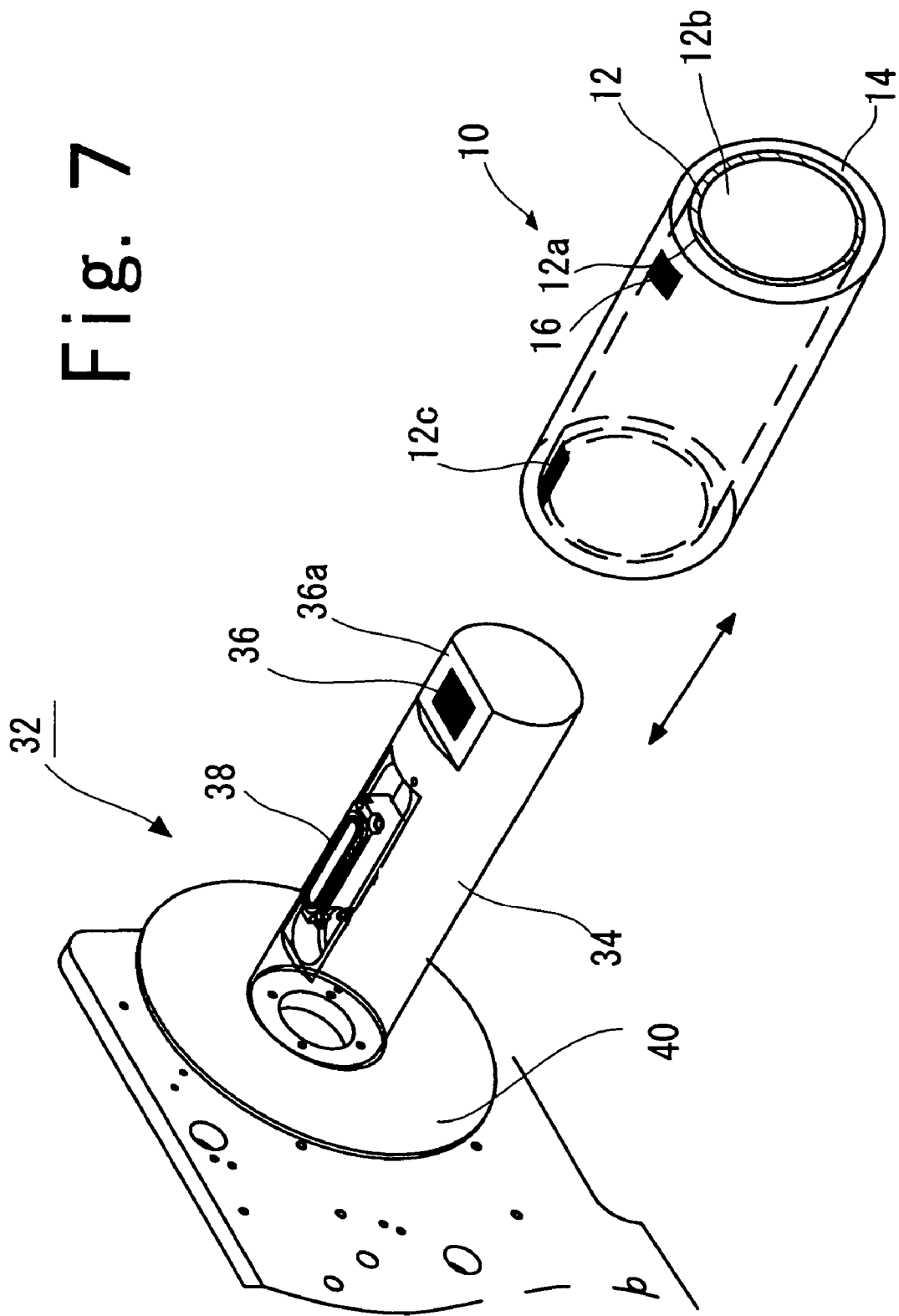
FIG. 7 is a schematic perspective view for illustrating the method of using the feeding apparatus shown in FIG. 6.

FIG. 6 is a perspective view showing a part of a feeding apparatus in a semiconductor wafer processing tape sticking apparatus using a semiconductor wafer processing tape winding body shown in FIG. 1, and FIG. 7 is a schematic perspective view for illustrating the method of using the feeding apparatus shown in FIG. 6.

As shown in FIG. 6, the semiconductor wafer processing tape sticking apparatus is provided with the feeding apparatus 32 that is provided with the feeding shaft 34 connected to a driving motor (not shown).

A tape data read/write device 36 is formed on the outer edge of the feeding shaft 34.

The tape data read/write device 36 is formed in a depression 36a that has been formed on the outer edge of the feeding shaft 34. By such a configuration, in the case in which the shaft member 12 of the semiconductor wafer processing tape winding body 10 is attached to or detached from the feeding shaft 34, the tape data read/write device 36 does not come into contact with the internal surface 12b of the shaft member 12, thus preventing the tape data read/write device 36 from being damaged or broken.

A detent member 38 capable of rising and setting is formed at the center of the feeding shaft 34 in such a manner that the detent member 38 is energized in the protruding direction by an energizing member (not shown). By such a configuration, in the case in which the shaft member 12 of the semiconductor wafer processing tape winding body 10 is attached to the feeding shaft 34, the shaft member 12 can rotate reliably by the rotation of the feeding shaft 34.

A side plate 40 is formed at the inner edge of the feeding shaft 34. By such a configuration, the edge of the shaft member 12 of the semiconductor wafer processing tape winding body 10 is abutted to the side plate 40, thus enabling the semiconductor wafer processing tape winding body 10 to be aligned.

The following describes a method of attaching the semiconductor wafer processing tape winding body 10 to the above configured feeding apparatus 32 to use the apparatus.

As shown in FIG. 7, the alignment section 12c of the shaft member 12 of the semiconductor wafer processing tape winding body 10 is aligned to the position of the tape data read/write device 36 of the feeding shaft 34. By such a manner, the tape data read/write device 36 of the feeding shaft 34 can be aligned to the data carrier member 16 arranged on the internal surface of the shaft member 12, and the processing data that has been written to the data carrier member 16 can be accurately read by the tape data read/write device 36 of the feeding shaft 34.

The shaft member 12 of the semiconductor wafer processing tape winding body 10 is then attached to the feeding shaft 34 of the feeding apparatus 32 (the feeding shaft 34 is inserted into the shaft member 12), and the edge of the shaft member 12 of the semiconductor wafer processing tape winding body 10 is abutted to the side plate 40 to align the semiconductor wafer processing tape winding body 10.

In the case in which the shaft member 12 of the semiconductor wafer processing tape winding body 10 is attached to the feeding shaft 34, the detent member 38 is protruded to reliably rotate the shaft member 12 by the rotation of the feeding shaft 34.

In the case in which the shaft member 12 of the semiconductor wafer processing tape winding body 10 is attached to the feeding shaft 34, information previously written to the data carrier member 16 arranged on the internal surface of the shaft member 12 is read by the tape data read/write device 36 arranged at the outer edge of the feeding shaft 34. For instance, the information is a product name, a quality assurance period, a length of a tape, a width of a tape, a lot number, a sticking pressure and a sticking speed that are optimum for a semiconductor wafer, and so on.

Based on the processing data that has been read by the tape data read/write device 36, the semiconductor wafer processing tape 14 that has been fed out from the feeding apparatus 32 can be stuck to the semiconductor wafer by a tape sticking apparatus (not shown).

In such a case, the tape sticking apparatus is not restricted in particular. The tape sticking apparatus is, for instance, a protection tape sticking apparatus that sticks a protection tape for protecting a circuit surface of the semiconductor wafer to the circuit surface of the semiconductor wafer in the case in which the back surface of the semiconductor wafer is grinded, and a mount tape sticking apparatus that sticks a mount tape to the ring frame and the back surface of the semiconductor wafer to integrate the ring frame with the periphery of the semiconductor wafer.

Consequently, information previously written to the data carrier member 16 is read by the tape data read/write device 36 without accessing to the host computer unlike a conventional method, and the semiconductor wafer processing tape 14 can be stuck to the semiconductor wafer under the optimum conditions based on the read processing data.

Accordingly, such information of the semiconductor wafer processing tape is not required to be separately stored in the host computer, and the information stored in the host computer is not required to be downloaded during wafer processing, thus enabling many kinds of wafer processing to be executed and simplifying process control.

Moreover, the information of a remainder amount and a quality assurance period of the semiconductor wafer processing tape 14 that has been used is written to the data carrier member 16 formed in the shaft member 12 and is read during wafer processing by the tape data read/write device 36, thus preventing the semiconductor wafer processing tape from running short, the quality assurance period from being exceeded, processes from being interrupted, and quality from being degraded.

Figure 8:
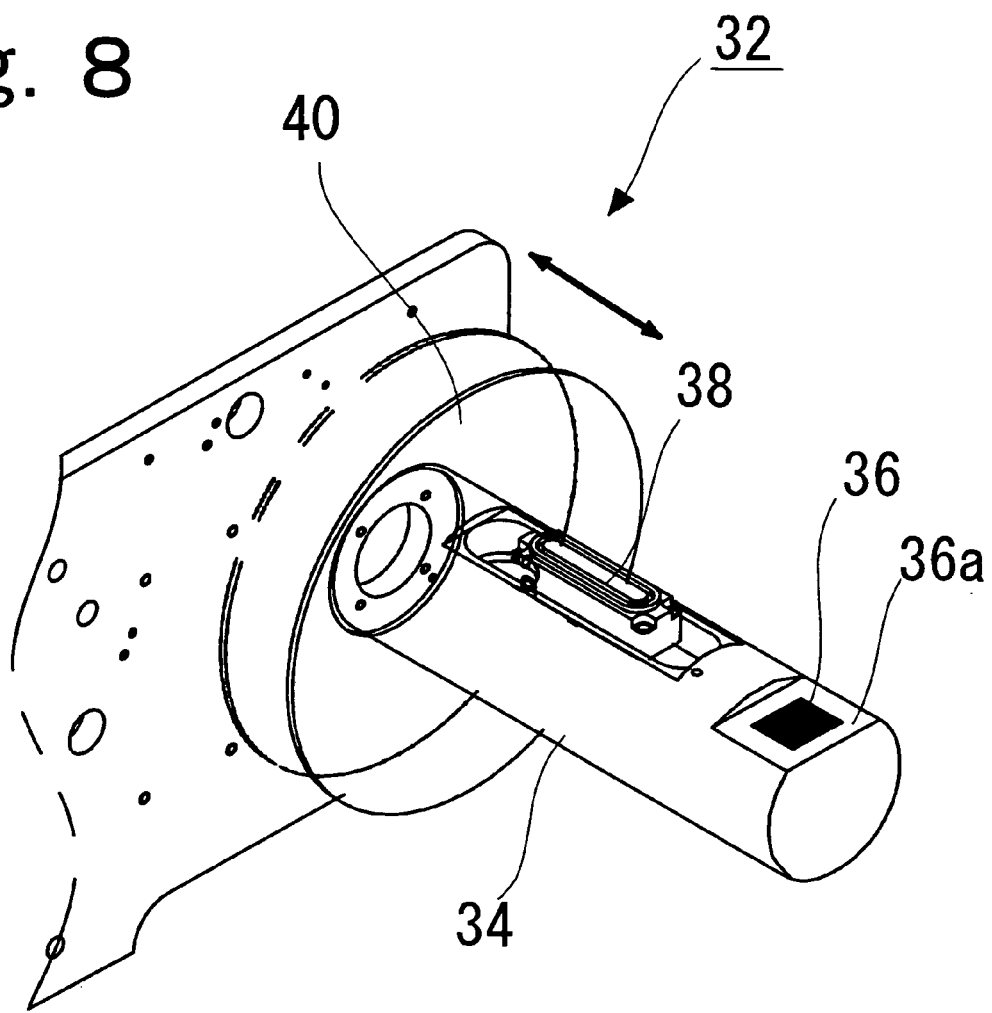
FIG. 8 is a schematic perspective view for showing another embodiment of the feeding apparatus.

In such a case, as shown by an arrow in FIG. 8, the side plate 40, to which the edge of the shaft member 12 is abutted, can be configured movably in the axial direction of the feeding shaft 34 by a moving mechanism (not shown) to correspond to each width of the semiconductor wafer processing tape 14 that is wound around the semiconductor wafer processing tape winding body 10.

In the case in which the data carrier member 16 is formed in the external surface 12a of the shaft member 12 as shown in FIG. 5, in place of reading information by the tape data read/write device 36 arranged at the outer edge of the feeding shaft 34 as shown in FIG. 6, it is also possible to read information by a tape data read/write device that is formed separately from the feeding shaft 34 or a portable tape data read/write device (not shown).

A semiconductor wafer processing apparatus and a semiconductor wafer processing method for manufacturing semiconductors by using the semiconductor wafer processing tape winding body 10 with the above described configuration will be described below with reference to FIGS. 9 to 18.

FIGS. 9 to 13 are schematic views for illustrating a semiconductor wafer processing method, and FIGS. 14 to 18 are flowcharts for describing the steps.

Figure 9:
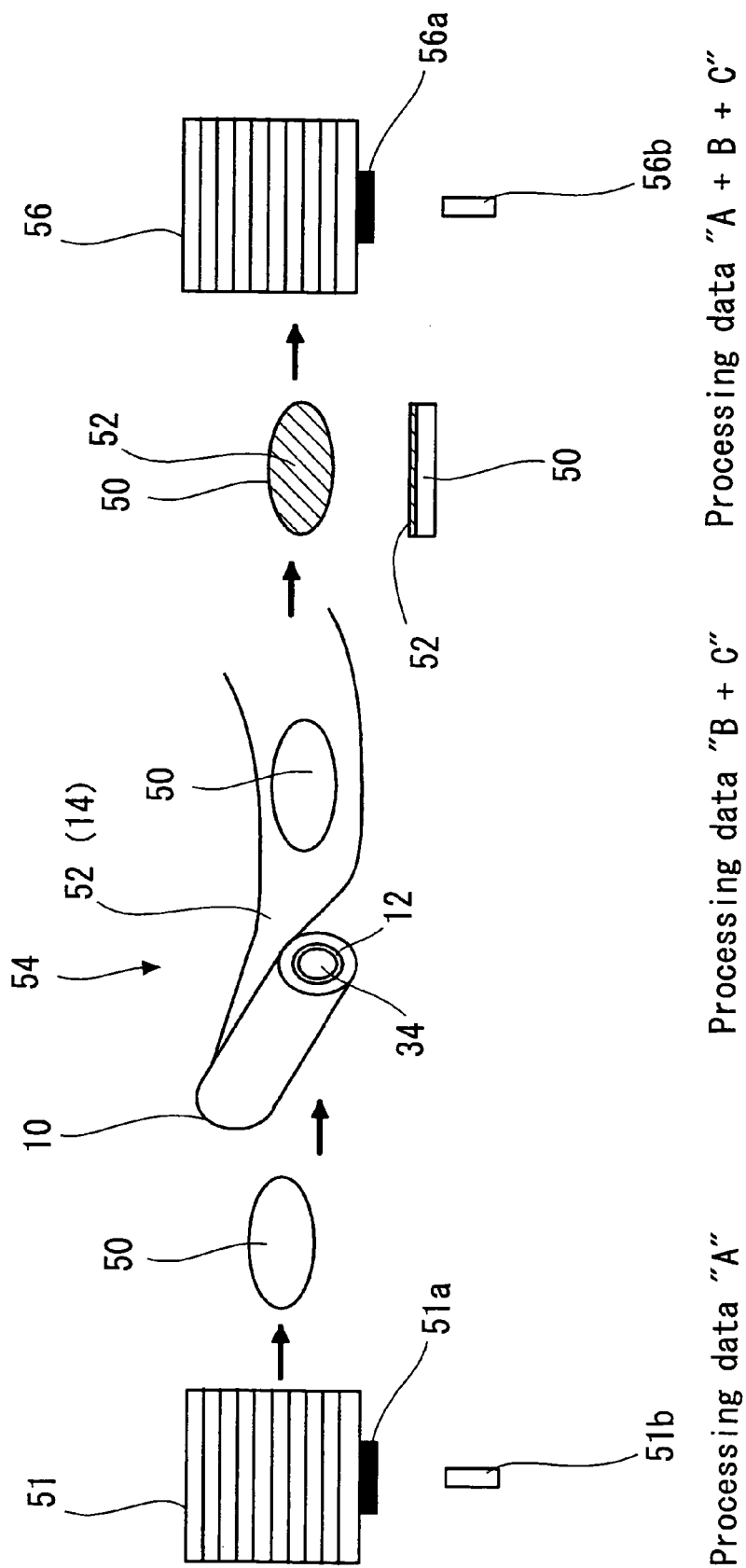
FIG. 9 is a schematic view for illustrating a protection tape sticking process of a semiconductor wafer processing method.

As shown in FIG. 9, a semiconductor wafer 50 on which a circuit has been formed is taken out from a semiconductor wafer storage cassette 51, a protection tape 52 for protecting the circuit surface of the semiconductor wafer 50 is stuck to the circuit surface of the semiconductor wafer 50 by using a protection tape sticking apparatus 54, and the protection tape 52 is cut along the shape of the semiconductor wafer 50 (protection tape sticking process).

In this case, the protection tape 52 is not restricted in particular. For instance, "Adwill E-6152" or "Adwill P-7180" (product name) manufactured by LINTEC Corporation can be adopted.

Moreover, the protection tape sticking apparatus 54 is not restricted in particular. For instance, an apparatus having a system of "RAD-3500F/12" (product name) manufactured by LINTEC Corporation can be adopted.

In this protection tape sticking process, a data carrier member 51a, which is similar to the data carrier member 16 arranged on the shaft member 12 of the semiconductor wafer processing tape winding body 10, is formed in the semiconductor wafer storage cassette 51. The information "A" with relation to the semiconductor wafer 50 such as a lot number, a kind, and a thickness of the semiconductor wafer 50 that has been written to the data carrier member 51a can be read by a cassette data reading apparatus 51b (see a step 100 in FIG. 14).

In this case, the data carrier member 16 is not restricted in particular. For instance, "TS-L102KC" or "TS-L301EC" (product name) that was manufactured by LINTEC Corporation and that conforms to ISO 15693 can be adopted.

Moreover, the data carrier member 51a (and data carrier members 56a, 60a, 66a, 70a, and 74a that will be described later) is not restricted in particular. For instance, "TS-L102DC" or "TS-L301FC" (product name) that was manufactured by LINTEC Corporation and that conforms to ISO 15693 can be adopted.

Furthermore, the cassette data reading apparatus 51b (and cassette data reading apparatuses 56c, 60c, 70c, and 74c that will be described later) is not restricted in particular. For instance, "LPA01" (product name) manufactured by LINTEC Corporation can be adopted.

In this state, the shape of the protection tape 52 corresponds to that of the semiconductor wafer processing tape winding body 10 as described above.

Consequently, by attaching the shaft member 12 of the semiconductor wafer processing tape winding body 10 to the feeding shaft 34, the information "B" that has been written to the data carrier member 16 arranged in the shaft member 12 is read by the tape data read/write device 36 arranged at the outer edge of the feeding shaft 34 (see a step 102 in FIG. 14). For instance, the information B is a product name, a quality assurance period, a length of a tape, a width of a tape, a lot number, a sticking pressure and a sticking speed that are optimum for a semiconductor wafer, and so on.

In this case, the tape data read/write device 36 is not restricted in particular. For instance, "LPA01" (product name) manufactured by LINTEC Corporation can be adopted.

Based on the processing data "A" with relation to the semiconductor wafer 50 that has been read by the cassette data reading apparatus and the processing data "B" with relation to the protection tape 52 that has been read by the tape data read/write device 36, the protection tape 52 that has been fed out from the feeding apparatus 32 can be stuck to the semiconductor wafer 50 by the protection tape sticking apparatus 54 (see a step 104 in FIG. 14).

Consequently, the processing data previously written to the data carrier member 16 can be read by the tape data read/write device 36 without accessing to the host computer unlike a conventional method, and the semiconductor wafer processing tape 14 can be stuck to the semiconductor wafer under the optimum conditions based on the read processing data.

The protection tape 52 that has been fed out from the feeding apparatus 32 is stuck to the semiconductor wafer 50 by the protection tape sticking apparatus 54, and the semiconductor wafer 50 is then stored into another semiconductor wafer storage cassette 56 (see a step 106 in FIG. 14).

The semiconductor wafer storage cassette 56 is provided with a data carrier member 56a similar to the data carrier member 16. The processing data "A+B+C", which is composed of the processing data "A" with relation to the semiconductor wafer 50, the processing data "B" with relation to the protection tape 52, and the processing data "C" with relation to the sticking processing such as a sticking speed and a sticking pressure in actual sticking processing using the protection tape sticking apparatus 54, is written to the data carrier member 56a by a cassette data writing apparatus 56b (see a step 108 in FIG. 14).

In such a case, the cassette data writing apparatus 56b (and cassette data writing apparatuses 60b and 70b that will be described later) is not restricted in particular. For instance, "LPA01" (product name) manufactured by LINTEC Corporation can be adopted.

If necessary, the information of a remainder amount and a quality assurance period of the protection tape 52 that has been used is written to the data carrier member 16 formed in the shaft member 12 by the tape data read/write device 36 and is read in the case in which the protection tape 52 is stuck to another kind of semiconductor wafer 50 (not shown), thus preventing the protection tape 52 from running short, the quality assurance period from being exceeded, processes from being interrupted, and quality from being degraded (see a step 108' in FIG. 14).

Figure 10:
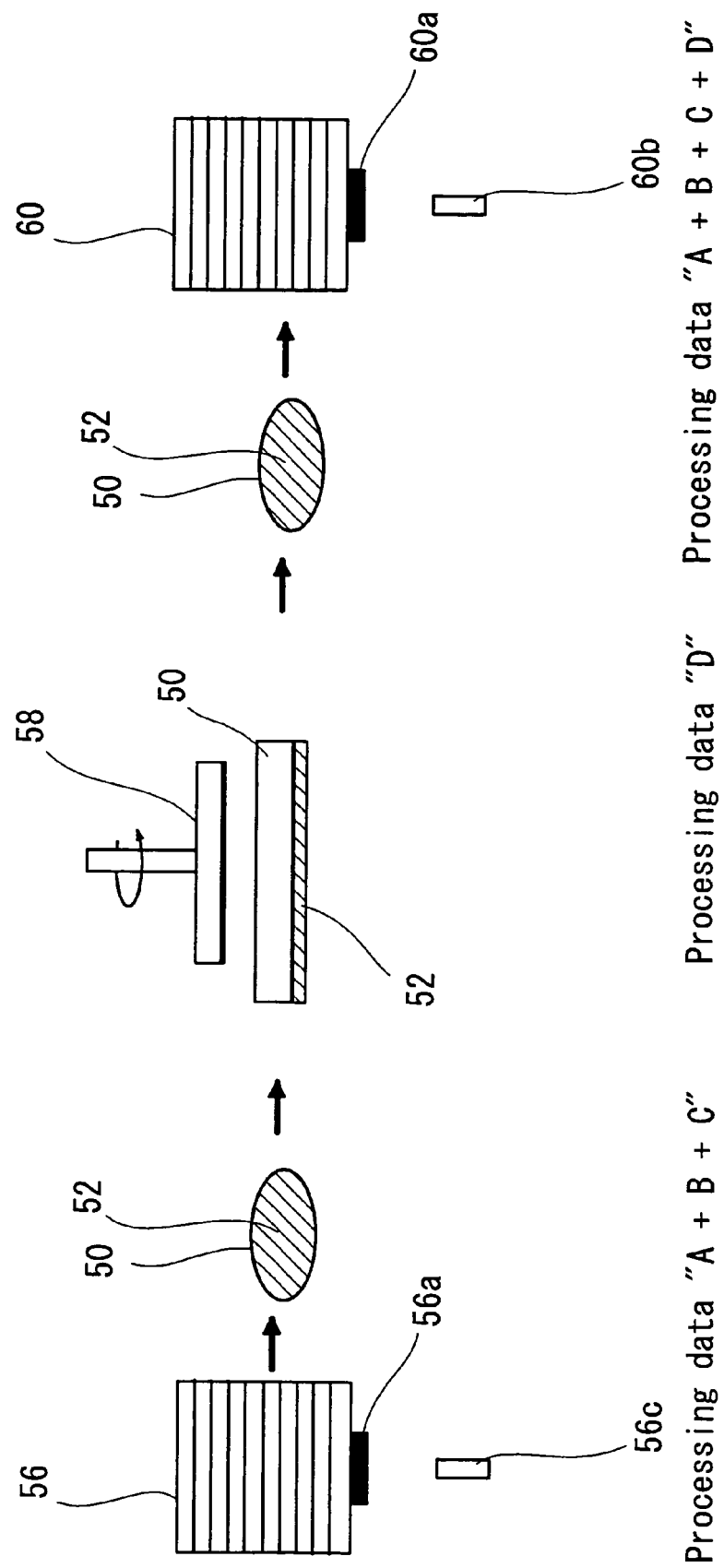
FIG. 10 is a schematic view for illustrating a back grinding process of a semiconductor wafer processing method.

Next, as shown in FIG. 10, the semiconductor wafer 50 is taken out from the semiconductor wafer storage cassette 56, the protection tape 52 side of the semiconductor wafer 50 to which the protection tape 52 has been stuck is sucked and held on a suction table (not shown), and a back surface on which a circuit has not been formed is grinded up to the specified thickness by a back grinder 58 (back grinding process).

In this case, the back grinder 58 is not restricted in particular. For instance, the back grinder manufactured by DISCO CORPORATION to which "LPA01" (product name) manufactured by LINTEC Corporation has been attached as a tape data read/write device can be adopted.

In the back grinding process, the above described processing data "A+B+C" that has been written to the data carrier member 56a of the semiconductor wafer storage cassette 56 is read by the cassette data reading apparatus 56c (see a step 110 in FIG. 15).

Next, the semiconductor wafer 50 is taken out from the semiconductor wafer storage cassette 56, and a back surface on which a circuit has not been formed is grinded up to the specified thickness under the optimum conditions by the back grinder 58 based on the processing data "A+B+C" that has been read by the cassette data reading apparatus 56c (see a step 112 in FIG. 15).

The semiconductor wafer 50 on which the protection tape 52 has been stuck and of which a back surface has been grinded up to the specified thickness is then stored into another semiconductor wafer storage cassette 60 (see a step 114 in FIG. 15).

In such a case, the semiconductor wafer storage cassette 60 is also provided with a data carrier member 60a. The processing data "A+B+C+D", which is composed of the processing data "A+B+C" and the processing data "D" with relation to the back grinding processing such as information of a grinding speed and grain size of the grinder in actual back grinding processing using the back grinder 58, is written to the data carrier member 60a by a cassette data writing apparatus 60b (see a step 116 in FIG. 15).

After that, as shown in FIG. 11, the semiconductor wafer 50 is taken out from the semiconductor wafer storage cassette 60, the protection tape 52 side of the semiconductor wafer 50 is sucked and held on a suction table 64, and a ring frame 66 is placed on the periphery of the semiconductor wafer 50 by a mount tape sticking apparatus 62.

In this case, the mount tape sticking apparatus 62 is not restricted in particular. For instance, an apparatus having a system of "RAD-2700F/Sa" (product name) manufactured by LINTEC Corporation can be adopted.

In the above state, a mount tape 68 is stuck to the top surface and then cut along the outline of the ring frame 66. Consequently, the semiconductor wafer 50 and the ring frame 66 are integrated into one body through the mount tape 68 (wafer mount process).

In this case, the mount tape 68 is not restricted in particular. For instance, "Adwill D-175" or "Adwill G-36" (product name) manufactured by LINTEC Corporation can be adopted.

In the wafer mount process, the semiconductor wafer 50 is then inverted upside down together with the ring frame, and the protection tape 52 is peeled from the circuit surface of the semiconductor wafer 50 by using a peeling tape (not shown) or the like.

In the wafer mount process, the above described processing data "A+B+C+D" that has been written to the data carrier member 60a of the semiconductor wafer storage cassette 60 is read by the cassette data reading apparatus 60c (see a step 118 in FIG. 16).

Next, the semiconductor wafer 50 is taken out from the semiconductor wafer storage cassette 60, the ring frame 66 is stuck through the mount tape 68 to the periphery of the semiconductor wafer 50 by the mount tape sticking apparatus 62, and the mount tape 68 is cut along the outline of the ring frame 66 (or the mount tape 68 is cut in advance in such a manner that the outline of the mount tape 68 is equivalent to that of the ring frame 66 and then stuck on the top surface) under the optimum conditions based on the processing data "A+B+C+D" that has been read by the cassette data reading apparatus 60c. Consequently, the semiconductor wafer 50 and the ring frame 66 are integrated into one body through the mount tape 68 (see a step 120 in FIG. 16).

The protection tape 52 is then peeled from the circuit surface of the semiconductor wafer 50 by using a peeling tape (not shown) or the like (see a step 122 in FIG. 16).

The ring frame 66 is also provided with a data carrier member 66a. The processing data "A+B+C+D+E", which is composed of the processing data "A+B+C+D" and the processing data "E" with relation to the mount tape sticking processing such as the information of a sticking speed and a sticking pressure of the mount tape 68 and a kind, dimensions, and a thickness of the ring frame 66 in actual mount tape sticking processing using the mount tape sticking apparatus 62, is written to the data carrier member 66a by a ring frame data writing apparatus 66b (see a step 124 in FIG. 16).

The semiconductor wafer 50 from which the protection tape 52 has been peeled and that has been integrated with the ring frame 66 through the mount tape 68 is then stored into another semiconductor wafer storage cassette 70 (see a step 126 in FIG. 16).

The semiconductor wafer storage cassette 70 is also provided with a data carrier member 70a. The processing data "A+B+C+D+E", which is composed of the processing data "A+B+C+D" and the processing data "E" with relation to the mount tape sticking processing such as the information of a sticking speed and a sticking pressure of the mount tape 68 and a kind, dimensions, and a thickness of the ring frame 66 in actual mount tape sticking processing using the mount tape sticking apparatus 62, is written to the data carrier member 70a by a cassette data writing apparatus 70b (see a step 128 in FIG. 16).

In the present embodiment, the processing data "A+B+C+D+E" is written to both the data carrier member 66a of the ring frame 66 and the data carrier member 70a of the semiconductor wafer storage cassette 70. However, the processing data "A+B+C+D+E" can also be written to either of the data carrier member 66a or the data carrier member 70a.

After that, as shown in FIG. 12, the semiconductor wafer 50 is taken out together with the ring frame 66 from the semiconductor wafer storage cassette 70 and is cut in a dice pattern by using a dicing apparatus 72 (dicing process).

In this case, the dicing apparatus 72 is not restricted in particular. For instance, the dicing apparatus manufactured by DISCO CORPORATION to which "LPA01" (product name) manufactured by LINTEC Corporation has been attached as a tape data read/write device can be adopted.

In the dicing process, the above described processing data "A+B+C+D+E" that has been written to the data carrier member 70a of the semiconductor wafer storage cassette 70 is read by a cassette data reading apparatus 70c (see a step 130 in FIG. 17).

In addition, the semiconductor wafer 50 is taken out from the semiconductor wafer storage cassette 70, and the above described processing data "A+B+C+D+E" that has been written to the data carrier member 66a of the ring frame 66 is read by a ring frame data reading apparatus 66c (see a step 132 in FIG. 17).

In such a case, the ring frame data reading apparatus 66c (and a ring frame data reading apparatus 66e that will be described later) is not restricted in particular. For instance, "LPA01" (product name) manufactured by LINTEC Corporation can be adopted.

The semiconductor wafer 50 is then cut in a dice pattern by using the dicing apparatus 72 under the optimum conditions based on the processing data "A+B+C+D+E" read by the cassette data reading apparatus 70c and the ring frame data reading apparatus 66c (see a step 134 in FIG. 17).

In the present embodiment, the semiconductor wafer 50 is cut in a dice pattern by using the dicing apparatus 72 based on the processing data "A+B+C+D+E" read by both the cassette data reading apparatus 70c and the ring frame data reading apparatus 66c. However, the processing data "A+B+C+D+E" can also be read from either of the cassette data reading apparatus 70c or the ring frame data reading apparatus 66c.

The processing data "A+B+C+D+E+F", which is composed of the processing data "A+B+C+D+E" and the processing data "F" with relation to the dicing processing such as the information of a rotation speed of a dicing blade and dicing dimensions of the dicing apparatus 72 in actual dicing processing using the dicing apparatus 72, is written to the data carrier member 66a of the ring frame 66 by a ring frame data writing apparatus 66d (see a step 136 in FIG. 17).

In this case, the ring frame data writing apparatus 66d is not restricted in particular. For instance, "LPA01" (product name) manufactured by LINTEC Corporation can be adopted.

After that, the semiconductor wafer 50 that has been cut in a dice pattern by using the dicing apparatus 72 is stored together with the ring frame 66 into another semiconductor wafer storage cassette 74 (see a step 138 in FIG. 17).

The semiconductor wafer storage cassette 74 is also provided with a data carrier member 74a. The processing data "A+B+C+D+E+F", which is composed of the processing data "A+B+C+D+E" and the processing data "F" with relation to the dicing processing such as the information of a rotation speed of a dicing blade and dicing dimensions of the dicing apparatus 72 in actual dicing processing using the dicing apparatus 72, is written to the data carrier member 74a by a cassette data writing apparatus 74b (see a step 140 in FIG. 17).

In the present embodiment, the processing data "A+B+C+D+E+F" is written to both the data carrier member 66a of the ring frame 66 and the data carrier member 74a of the semiconductor wafer storage cassette 74. However, the processing data "A+B+C+D+E+F" can also be written to either of the data carrier member 66a or the data carrier member 74a.

After that, as shown in FIG. 13, the semiconductor wafer 50 is taken out together with the ring frame 66 from the semiconductor wafer storage cassette 74, and a semiconductor chip that has been cut in a dice pattern is picked up and mounted on the electronic component mounting section of an electronic component 78 by using a bonding apparatus 76 (die bonding process).

In this case, the sticking apparatus 76 is not restricted in particular. For instance, the sticking apparatus manufactured by SHINKAWA LTD. to which "LPA01" (product name) manufactured by LINTEC Corporation has been attached as a tape data read/write device can be adopted.

Figure 18:
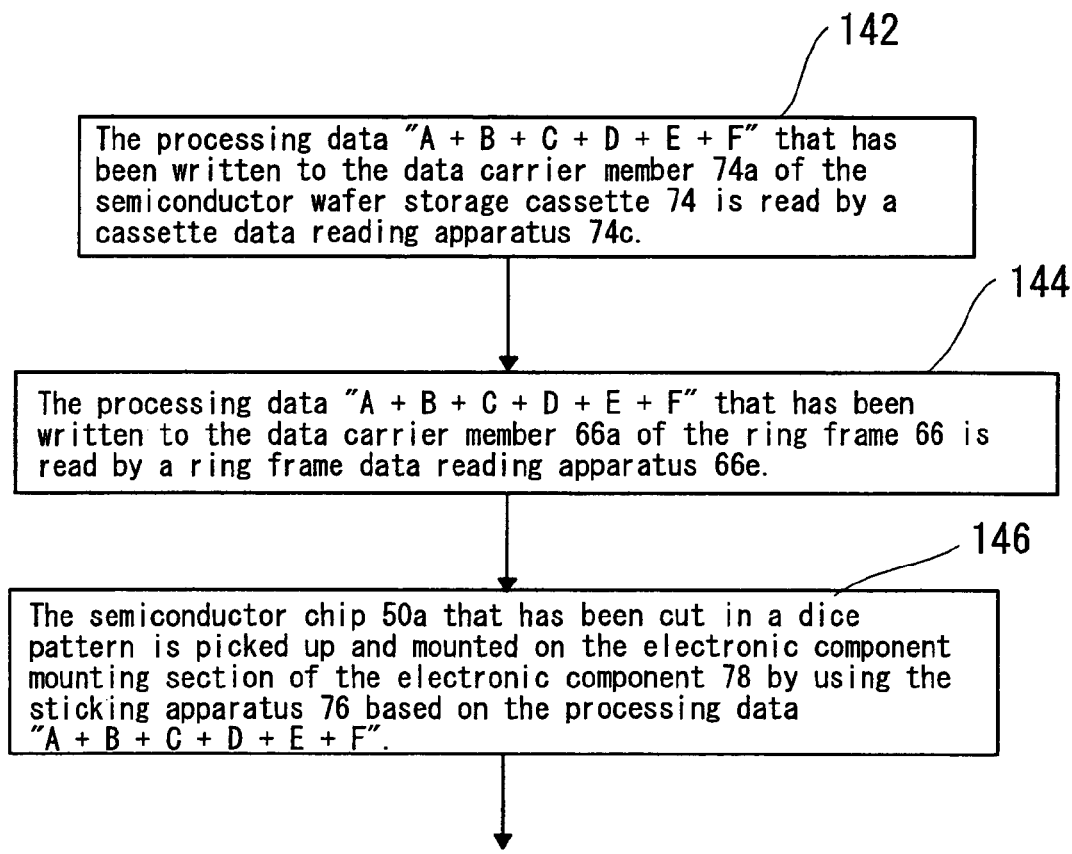
FIG. 18 is a flowchart for describing a die bonding process of a semiconductor wafer processing method.

In the die bonding process, the above described processing data "A+B+C+D+E+F" that has been written to the data carrier member 74a of the semiconductor wafer storage cassette 74 is read by a cassette data reading apparatus 74c (see a step 142 in FIG. 18).

The semiconductor wafer 50 is taken out from the semiconductor wafer storage cassette 74, and the above described processing data "A+B+C+D+E+F" that has been written to the data carrier member 66a of the ring frame 66 is read by a ring frame data reading apparatus 66e (see a step 144 in FIG. 18).

The semiconductor chip 50a that has been cut in a dice pattern is then picked up and mounted on the electronic component mounting section of the electronic component 78 by using the sticking apparatus 76 under the optimum conditions based on the processing data "A+B+C+D+E+F" read by the cassette data reading apparatus 74c and the ring frame data reading apparatus 66e (see a step 146 in FIG. 18).

In the present embodiment, the semiconductor chip 50a that has been cut in a dice pattern is picked up and mounted on the electronic component mounting section of the electronic component 78 by using the sticking apparatus 76 based on the processing data "A+B+C+D+E+F" read by both the cassette data reading apparatus 74c and the ring frame data reading apparatus 66e. However, the processing data "A+B+C+D+E+F" can also be read from either of the cassette data reading apparatus 74c or the ring frame data reading apparatus 66e.

In the above embodiment, a method of forming a data carrier member in a semiconductor wafer storage cassette, the arrangement position of the data carrier member, a method of forming the data carrier member 66a in the ring frame 66, and the arrangement position of the data carrier member 66a are not restricted in particular.

That is to say, similarly to the case of the data carrier member 16 formed in the shaft member 12 of the semiconductor wafer processing tape winding body 10, any of the following methods can be adopted: a method of using the sticking label type structure of the data carrier member, a method of arranging the data carrier member in the mounting depression and burying the data carrier member in the mounting depression by sealing the upper surface of the data carrier member with synthetic resin, and a method of forming the data carrier member 16 in one body with the semiconductor wafer storage cassette or the ring frame 66.

As a position where the data carrier member is formed on the semiconductor wafer storage cassette in the present embodiment, the data carrier member is formed on the bottom surface of the semiconductor wafer storage cassette. According to the position, the cassette data reading apparatus and the cassette data writing apparatus are arranged in such a manner that the cassette data reading apparatus and the cassette data writing apparatus face to the bottom surface of the semiconductor wafer storage cassette.

However, the position where the data carrier member is formed on the semiconductor wafer storage cassette is not restricted to the present embodiment but can be suitably modified to the top, side, or back of the semiconductor wafer storage cassette. According to the position, the cassette data reading apparatus and the cassette data writing apparatus can be arranged in such a manner that the cassette data reading apparatus and the cassette data writing apparatus face to the top, side, or back surface of the semiconductor wafer storage cassette.

Moreover, in the present embodiment, the ring frame data reading apparatus is arranged and fixed in such a manner that the ring frame data reading apparatus faces to the data carrier member 66a of the ring frame 66. However, the ring frame data reading apparatus can also be formed at the tip of an ejection apparatus such as a suction arm that takes out the semiconductor wafer 50 from the semiconductor wafer storage cassette, and the processing data that has been stored in the data carrier member 66a of the ring frame 66 can be read in the case in which the semiconductor wafer 50 is taken out.

Similarly, the ring frame data writing apparatus can also be formed at the tip of an storing apparatus such as a suction arm that stores the semiconductor wafer 50 into the semiconductor wafer storage cassette, and the processing data can be written to the data carrier member 66a of the ring frame 66 in the case in which the semiconductor wafer 50 is stored.

By such a semiconductor wafer processing method, the information of a product name, a quality assurance period, a length of a tape, a width of a tape, a lot number, and a sticking pressure and a sticking speed that are optimum for a semiconductor wafer, etc., can be written to the data carrier member 16 formed in the shaft member 12.

By the above configuration, in the case in which the semiconductor wafer processing tape 14 (the protection tape 52 or the mount tape 68) that has been wound around the semiconductor wafer processing tape winding body 10 is stuck to the semiconductor wafer 50 and many kinds of wafer processing for the semiconductor wafer 50 are executed, the processing data that has been written to the data carrier member 16 formed in the shaft member 12 of the semiconductor wafer processing tape winding body 10, the data carrier member of the semiconductor wafer storage cassette, and the data carrier member 66a of the ring frame 66 can be read without accessing to the host computer unlike a conventional method, and many kinds of wafer processing can be executed using the semiconductor wafer processing tape under the optimum conditions based on the read processing data.

Accordingly, such information of the semiconductor wafer processing tape is not required to be separately stored in the host computer, and the information stored in the host computer is not required to be downloaded from the host computer during wafer processing, thus enabling many kinds of wafer processing to be executed and simplifying process control.

Moreover, the information of a remainder amount and a quality assurance period of the semiconductor wafer processing tape that has been used is written to the data carrier member 16 formed in the shaft member 12 and is read during wafer processing, thus preventing the semiconductor wafer processing tape from running short, the quality assurance period from being exceeded, processes from being interrupted, and quality from being degraded.

While the preferred embodiments of the present invention have been described above, the present invention is not restricted to the embodiments. For example, an alarm can be given in the case in which a wrong semiconductor wafer processing tape winding body 10 is attached to the feeding apparatus 32, the quality assurance period of the semiconductor wafer processing tape is exceeded, or the number of use for the grinding stone member of the back grinder 58 or for the dicing blade of the dicing apparatus 72 exceeds the limitation of use, thus preventing an operator from making an error.

Moreover, the semiconductor wafer storage cassette and the ring frame 66 can be reused by recovering the shaft member 12 of the semiconductor wafer processing tape winding body 10, the semiconductor wafer storage cassette, and the ring frame 66 and by initializing the processing data that has been written to the data carrier members in the shaft member 12, the semiconductor wafer storage cassette, and the ring frame 66.

Furthermore, while apparatuses that are used in the above described processes are separate apparatuses, that is, standalone type apparatuses are used in the present embodiment, consecutive processing can also be executed by using an in-line type apparatus. In the case in which such an in-line type apparatus is used, the number of the semiconductor wafer storage cassettes and cassette data reading apparatuses can be reduced. In this case, the processing data can be written or read by the data carrier member 66a of the ring frame 66.

Still further, in the present embodiment, the semiconductor wafer storage cassette of the ejection side and the semiconductor wafer storage cassette that stores the semiconductor wafer to which the specified wafer processing has been completed are formed separately. However, the semiconductor wafer can also be taken out from a semiconductor wafer storage cassette one by one and stored into the same semiconductor wafer storage cassette after wafer processing.

Still further, data with regard to shortage and management data can also be written (input) to each apparatus and each data carrier member for control in each wafer processing step from an host computer (not shown).

For example, while the so-called "post-dicing method" has been described in the above embodiment, the "pre-dicing method" can also be used, and various changes can be thus made without departing from the scope of the present invention. The sequence of steps in the pre-dicing method is a step for dicing a wafer surface on which a circuit has been formed up to the specified depth in the wafer thickness direction, a step for forming grooves with a bottom in a dice pattern, a step for sticking a protection tape on the surface of the wafer, a step for grinding the back surface of the wafer up to the bottom of the grooves to divide the wafer into a plurality of chips, a step for sticking the wafer provided with the stuck protection tape to the ring frame, and a step for peeling the protection tape.

What is claimed is:

1. A semiconductor wafer processing tape winding body comprising:
 a semiconductor wafer processing tape for processing a semiconductor wafer by being stuck to the semiconductor wafer,
 a shaft member for winding the semiconductor wafer processing tape,
 a data carrier member being formed in the shaft member and capable of reading and writing desired processing data, and
 a data carrier member mounting depression formed in an internal surface of the shaft member for mounting the data carrier member,
 wherein the data carrier member is a non-contact type data carrier member that is an RF memory configured by an IC chip and a conductive coil connected to the IC chip,
 an alignment section is formed at a position corresponding to the data carrier member in the shaft member and is provided to align the data carrier member with a tape data read/write device of a semiconductor wafer processing tape sticking apparatus,
 the desired processing data is information data including at least one of: a product name, a quality assurance period, a length, a width, and a lot number of the semiconductor wafer processing tape,
 the data carrier member is mounted in the data carrier member mounting depression, and
 a surface of the data carrier member mounted in the data carrier member mounting depression and the internal surface of the shaft member are on the same plane or the surface of the data carrier member mounted in the data carrier mounting depression is lower than the internal surface of the shaft member.

2. A semiconductor wafer processing tape sticking apparatus comprising:
 a feeding apparatus provided with a feeding shaft to which the semiconductor wafer processing tape winding body as defined in claim 1 can be detachably attached,
 the tape data read/write device for reading and writing the processing data that has been written to the data carrier member of the semiconductor wafer processing tape winding body, and
 a tape sticking apparatus for sticking a semiconductor wafer processing tape that has been fed out from the feeding apparatus to the semiconductor wafer based on a processing data that has been read by the tape data read/write device,
 wherein the tape data read/write device is provided in the feeding shaft, and
 the processing data to be written to the data carrier member formed in the semiconductor wafer processing tape winding body is information data including at least one of a product name, a quality assurance period, a length, a width, and a lot number of the semiconductor wafer processing tape.

3. A semiconductor wafer processing tape sticking apparatus as defined in claim 2, further comprising a cassette data writing apparatus for writing desired processing data to a data carrier member formed in a semiconductor wafer storage cassette, wherein the semiconductor wafer storage cassette stores the semiconductor wafer to which the semiconductor wafer processing tape has been stuck by the tape sticking apparatus, and the desired processing data to be written to the data carrier member formed in the semiconductor wafer storage cassette is an information data including at least one of:

information data according to the semiconductor wafer processing tape including at least one of a product name, a quality assurance period, a length, a width, and a lot number of the semiconductor wafer processing tape, and a sticking pressure and a sticking speed that are optimum for the semiconductor wafer; and information data according to the semiconductor wafer including at least one of a kind, a thickness and a processing condition in a processing step of the semiconductor wafer.

4. A semiconductor wafer processing tape sticking apparatus as defined in claim 3, further comprising a cassette data reading apparatus for reading the processing data that has been written to the data carrier member formed in a semiconductor wafer storage cassette that stores a semiconductor wafer to which the specified processing has been performed in the preceding process, wherein a semiconductor wafer processing tape is stuck to the semiconductor wafer by the tape sticking apparatus based on the processing data that has been read by the cassette data reading apparatus and the processing data that has been read by the tape data read/write device.

5. A semiconductor wafer processing tape sticking apparatus as defined in claim 2, wherein the semiconductor wafer processing tape sticking apparatus is a protection tape sticking apparatus for sticking a protection tape that protects a circuit surface of the semiconductor wafer.

6. A semiconductor wafer processing tape sticking apparatus as defined in claim 2, wherein the semiconductor wafer processing tape sticking apparatus is a mount tape sticking apparatus for sticking a mount tape that sticks a ring frame to the periphery of the semiconductor wafer.

7. A semiconductor wafer processing tape sticking apparatus as defined in claim 6, further comprising a ring frame data writing apparatus for writing desired processing data to a data carrier member formed in the ring frame.

8. A semiconductor wafer processing apparatus, wherein the specified wafer processing is performed to the semiconductor wafer to which the semiconductor wafer processing tape has been stuck by the semiconductor wafer processing tape sticking apparatus as defined in claim 7 based on the processing data that has been written to the data carrier member formed in the ring frame.

9. A semiconductor wafer processing tape sticking apparatus as defined in claim 7, wherein the desired processing data writing to the data carrier member formed in the ring frame is an information data including at least one of:

information data according to the semiconductor wafer processing tape including at least any one of a product name, a quality assurance period, a length, a width, and a lot number of the semiconductor wafer processing tape, and a sticking pressure and a sticking speed that are optimum for a semiconductor wafer; and information data according to semiconductor wafer including at least one of a kind, a thickness, and a processing condition in a processing step of the semiconductor wafer.

10. A semiconductor wafer processing apparatus, wherein the specified wafer processing is performed to the semiconductor wafer to which the semiconductor wafer processing tape has been stuck by the semiconductor wafer processing tape sticking apparatus as defined in claim 2 based on the processing data that has been written to the data carrier member formed in the semiconductor wafer storage cassette that stores the semiconductor wafer to which the semiconductor wafer processing tape has been stuck by the tape sticking apparatus.

11. A semiconductor wafer processing apparatus as defined in claim 10, wherein the semiconductor wafer processing apparatus is a semiconductor wafer grinder for grinding the back surface opposite to the circuit surface of the semiconductor wafer.

12. A semiconductor wafer processing apparatus as defined in claim 10, wherein the semiconductor wafer processing apparatus is a dicing apparatus for cutting the semiconductor wafer in a dice pattern.

13. A semiconductor wafer processing apparatus as defined in claim 10, wherein the semiconductor wafer processing apparatus is a die bonding apparatus for picking up a semiconductor chip that has been cut in a dice pattern and mounting the semiconductor chip on the electronic component mounting section of an electronic component.

14. A semiconductor wafer processing tape sticking apparatus as defined in claim 2, wherein the tape data read/write device is provided in a depression formed in the feeding shaft.

15. A semiconductor wafer processing tape sticking apparatus as defined in claim 2, wherein a side plate is formed at the inner edge of the feeding shaft, the side plate being configured movably in the axial direction of the feeding shaft, and wherein the desired processing data is an information data further including at least any one of a sticking pressure and a sticking speed of a semiconductor wafer processing tape that are optimum for a semiconductor wafer.

16. A semiconductor wafer processing tape winding body as defined in claim 1, wherein the alignment section is any of a projection rib, a cut section, and a marking.

17. A protection tape sticking system comprising:

a protection tape winding body comprising a protection tape for protecting a circuit surface of a semiconductor wafer by being stuck to the semiconductor wafer;

a feeding apparatus provided with a feeding shaft to which the protection tape winding body can be detachably attached;

a protection tape sticking apparatus for sticking the protection tape that has been fed out from the feeding apparatus to the semiconductor wafer;

a tape data read/write device for reading and writing a processing data that has been written to a data carrier member of the protection tape winding body; and an alignment section formed at a position corresponding to the data carrier member in the protection tape winding body, wherein the tape data read/write device reads an information related to the protection tape that has been written to the data carrier member of the protection tape winding body, and the protection tape sticking apparatus sticks the protection tape to the semiconductor based on the information related to the protection tape.

* * * * *